US012592724B2

(12) United States Patent
Nakajima

(10) Patent No.: US 12,592,724 B2
(45) Date of Patent: Mar. 31, 2026

(54) RADIO FREQUENCY CIRCUIT AND COMMUNICATION DEVICE

(71) Applicant: Murata Manufacturing Co., Ltd., Nagaokakyo (JP)

(72) Inventor: Reiji Nakajima, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 323 days.

(21) Appl. No.: 18/411,054

(22) Filed: Jan. 12, 2024

(65) Prior Publication Data

US 2024/0223223 A1 Jul. 4, 2024

Related U.S. Application Data

(63) Continuation of application No. PCT/JP2022/019818, filed on May 10, 2022.

(30) Foreign Application Priority Data

Jul. 16, 2021 (JP) ................................. 2021-117968

(51) Int. Cl.
*H04B 1/00* (2006.01)
*H03F 3/24* (2006.01)
*H04B 1/04* (2006.01)
(52) U.S. Cl.
CPC ........... *H04B 1/0057* (2013.01); *H03F 3/245* (2013.01); *H03F 2200/165* (2013.01); *H03F 2200/171* (2013.01); *H03F 2200/451* (2013.01)
(58) Field of Classification Search
None
See application file for complete search history.

(56) References Cited

U.S. PATENT DOCUMENTS 11,245,381 B2 * 2/2022 Schmalzl ............. H03H 9/0547
2007/0077898 A1 * 4/2007 Mueller ............... H04B 1/0057
455/132

(Continued)

FOREIGN PATENT DOCUMENTS

JP 2014-195309 A 10/2014
JP 2017-017691 A 1/2017
(Continued)

OTHER PUBLICATIONS

International Search Report and Written Opinion mailed on Aug. 2, 2022, received for PCT Application PCT/JP2022/019818, filed on May 10, 2022, 25 pages including English Translation.
(Continued)

*Primary Examiner* — Pablo N Tran
(74) *Attorney, Agent, or Firm* — XSENSUS LLP

(57) ABSTRACT

Reduction of reception sensitivity, which is caused by inter-modulation distortion occurring between a first transmit signal and a second transmit signal, is suppressed. A first filter has a passband including the transmit band of a first communication band. A second filter has a passband including the transmit band of a second communication band. A third filter has a passband including the receive band of the first communication band. The first communication band and the second communication band are communication bands available for simultaneous transmission. At least a part of the frequency range of the inter-modulation distortion, which occurs between the first transmit signal in the first communication band and the second transmit signal in the second communication band, overlaps at least a part of the receive band of the first communication band.

20 Claims, 7 Drawing Sheets

(56)                    References Cited

U.S. PATENT DOCUMENTS

| | | | | | |
|---|---|---|---|---|---|
| 2012/0243446 | A1* | 9/2012 | Mueller | ............... | H04B 1/0057 |
| | | | | | 370/310 |
| 2017/0338839 | A1* | 11/2017 | Little | ...................... | H04B 1/56 |
| 2021/0119653 | A1 | 4/2021 | Peng et al. | | |
| 2024/0097756 | A1* | 3/2024 | Pehlke | ................ | H04B 1/1615 |
| 2025/0119165 | A1* | 4/2025 | Moon | ................... | H04B 1/006 |

FOREIGN PATENT DOCUMENTS

| | | |
|---|---|---|
| JP | 2017-158025 A | 9/2017 |
| JP | 2020-014205 A | 1/2020 |
| JP | 2020-145613 A | 9/2020 |
| JP | 2021-016019 A | 2/2021 |
| JP | 2021-048503 A | 3/2021 |
| JP | 2021-048558 A | 3/2021 |
| JP | 2021-048566 A | 3/2021 |
| JP | 2021-082974 A | 5/2021 |
| JP | 2021-093709 A | 6/2021 |
| WO | 2009/004733 A1 | 1/2009 |
| WO | 2016/117482 A1 | 7/2016 |
| WO | 2017/006866 A1 | 1/2017 |
| WO | 2017/073509 A1 | 5/2017 |
| WO | 2019/031307 A1 | 2/2019 |
| WO | 2019/176538 A1 | 9/2019 |
| WO | 2020/054388 A1 | 3/2020 |
| WO | 2020/153285 A1 | 7/2020 |

OTHER PUBLICATIONS

3GPP, "3rd Generation Partnership Project; Technical Specification Group Radio Access Network; Evolved Universal Terrestrial Radio Access (E-UTRA); User Equipment (UE) radio transmission and reception (Release 17)", 3GPP TS 36.101 V17.2.0, Jun. 2021, pp. 1-1618.

* cited by examiner

RADIO FREQUENCY CIRCUIT AND COMMUNICATION DEVICE

CROSS-REFERENCE TO RELATED APPLICATIONS

This is a continuation application of PCT/JP2022/019818, filed on May 10, 2022, designating the United States of America, which is based on and claims priority to Japanese Patent Application No. JP 2021-117968 filed on Jul. 16, 2021. The entire contents of the above-identified applications, including the specifications, drawings and claims, are incorporated herein by reference in their entirety.

TECHNICAL FIELD

The present disclosure generally relates to a radio frequency circuit and a communication device, and more particularly to a radio frequency circuit, which includes multiple filters, and a communication device, which includes the radio frequency circuit.

BACKGROUND ART

Advances in multiband technology of mobile communication devices such as a cellular phone have demanded a radio frequency circuit which is capable of simultaneous transmission of multiple radio frequency signals having different frequencies. For example, Patent Document 1 discloses an electronic system including two transmit circuits and two receive circuits.

CITATION LIST

Patent Document

Patent Document 1: Japanese Unexamined Patent Application Publication No. 2017-17691

SUMMARY OF DISCLOSURE

Technical Problem

The electronic system (radio frequency circuit) described in Patent Document 1 may cause the state in which, in simultaneous transmission of multiple radio frequency signals having different frequencies, the frequency of an inter-modulation distortion (IMD) between the radio frequency signals overlaps the receive band of a receive circuit, resulting in reduction of the reception sensitivity.

An object of the present disclosure is to provide a radio frequency circuit and a communication device which are capable of suppressing reduction of the reception sensitivity, which is caused by an inter-modulation distortion occurring between a first transmit signal and a second transmit signal.

Solution to Problem

A radio frequency circuit according to an aspect of the present disclosure includes a first filter, a second filter, a third filter, a first power amplifier, a second power amplifier, and a switch. The first filter has a passband including the transmit band of a first communication band. The second filter has a passband including the transmit band of a second communication band which is different from the first communication band. The third filter has a passband including the receive band of the first communication band. The first power amplifier is connected to the first filter. The second power amplifier is connected to the second filter. The switch has a first terminal, a second terminal, a third terminal, a fourth terminal, and a fifth terminal. The first communication band and the second communication band are communication bands available for simultaneous transmission. At least a part of the frequency range of inter-modulation distortion overlaps at least a part of the receive band of the first communication band. The inter-modulation distortion occurs between a first transmit signal in the first communication band and a second transmit signal in the second communication band. In the radio frequency circuit, the first terminal is connected to the first power amplifier; the second terminal is connected to the second power amplifier; the fourth terminal is connected to the first filter; the fifth terminal is connected to the second filter. The radio frequency circuit further includes a circuit connected to the third terminal. The circuit includes either one or both of an inductor and a capacitor.

A radio frequency circuit according to an aspect of the present disclosure includes a first filter, a second filter, a third filter, a low-noise amplifier, and a switch. The first filter has a passband including the transmit band of a first communication band. The second filter has a passband including the transmit band of a second communication band which is different from the first communication band. The third filter has a passband including the receive band of the first communication band. The low-noise amplifier is connected to the third filter. The switch has a first terminal, a second terminal, and a third terminal. The first communication band and the second communication band are communication bands available for simultaneous transmission. At least a part of the frequency range of inter-modulation distortion overlaps at least a part of the receive band of the first communication band. The inter-modulation distortion occurs between a first transmit signal in the first communication band and a second transmit signal in the second communication band. In the radio frequency circuit, the first terminal is connected to the low-noise amplifier, and the third terminal is connected to the third filter. The radio frequency circuit further includes a circuit connected to the second terminal. The circuit includes either one or both of an inductor and a capacitor.

A communication device according to an aspect of the present disclosure includes the radio frequency circuit and a signal processing circuit. The signal processing circuit is connected to the radio frequency circuit.

Advantageous Effects of Disclosure

The radio frequency circuit and the communication device according to an aspect of the present disclosure enable suppression of reduction of the reception sensitivity. The reduction is caused by an inter-modulation distortion which occurs between a first transmit signal and a second transmit signal.

DESCRIPTION OF EMBODIMENTS

Figure 1:
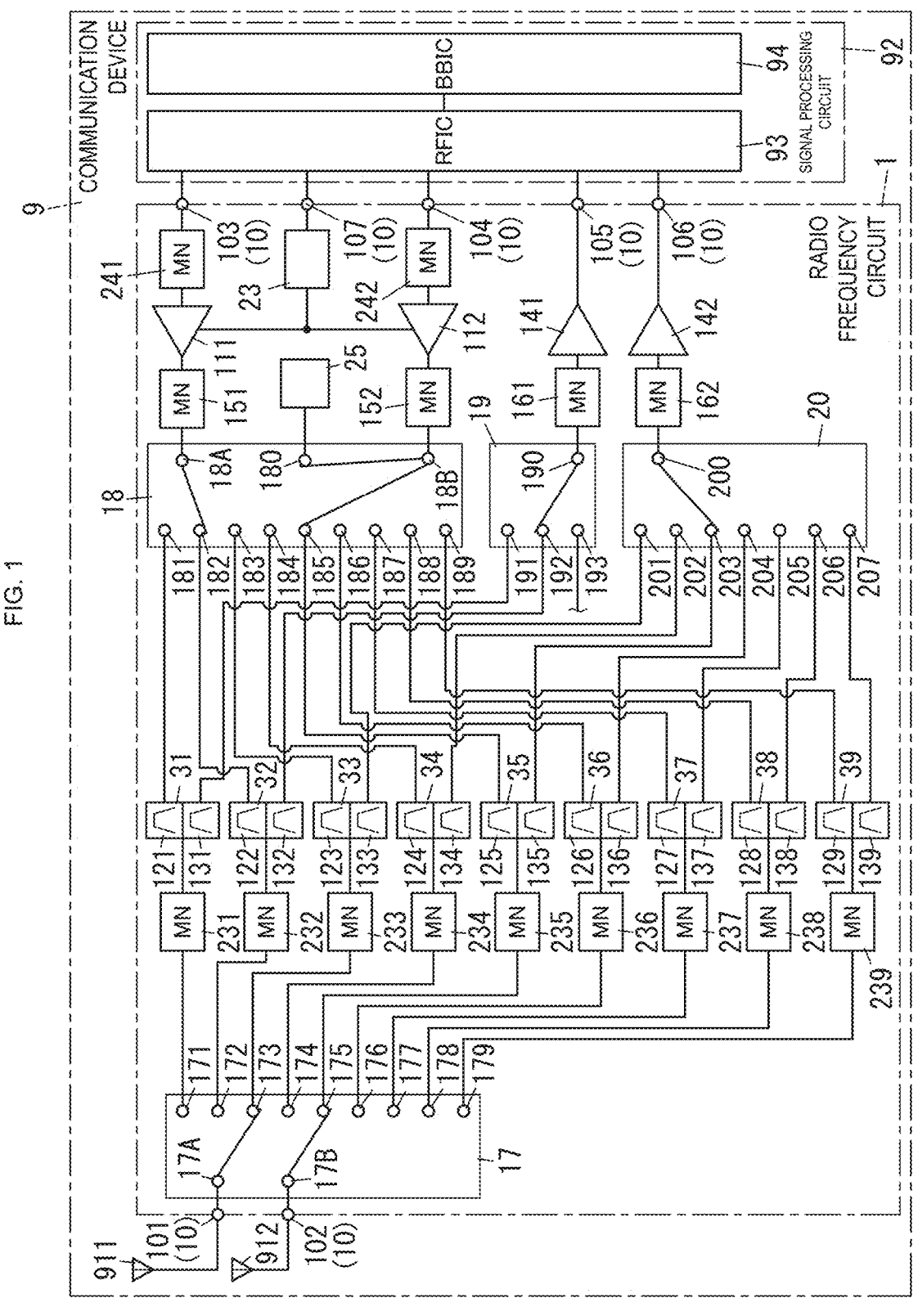
FIG. 1 is a diagram illustrating the circuit configuration of a communication device including a radio frequency circuit according to a first embodiment.

A radio frequency circuit and a communication device according to each of first to fifth embodiments will be described below by referring to the drawings. FIGS. 2 to 4, 6, and 7 referred to in the embodiments and the like are schematic views. The sizes, the thicknesses, and their ratios of components in the figures do not necessarily reflect the actual dimensional ratios.

First Embodiment

(1) Radio Frequency Circuit

The configuration of a radio frequency circuit 1 according to the first embodiment will be described by referring to drawings.

As illustrated in FIG. 1, the radio frequency circuit 1 is used, for example, in a communication device 9. The communication device 9 is, for example, a cellular phone such as a smartphone. The communication device 9 is not limited to a cellular phone, and may be, for example, a wearable terminal such as a smartwatch. The radio frequency circuit 1 is compatible, for example, with a 4G (fourth generation mobile communication) standard or a 5G (fifth generation mobile communication) standard. The 4G standard is, for example, a 3GPP™ (Third Generation Partnership Project) LTE™ (Long Term Evolution) standard. The 5G standard is compatible, for example, with 5G NR (New Radio).

The radio frequency circuit 1 is compatible, for example, with carrier aggregation and dual connectivity. The radio frequency circuit 1 is also compatible with two-uplink carrier aggregation in which two frequency bands are simultaneously used as uplink. The carrier aggregation and the dual connectivity refer to a technology used in communication of simultaneous use of radio waves in multiple frequency bands. Hereinafter, signal transmission using the carrier aggregation or the dual connectivity is also referred to as simultaneous transmission. The state in which simultaneous transmission is allowed means that signals are allowed to be transmitted by using the carrier aggregation or the dual connectivity.

The radio frequency circuit 1 according to the first embodiment is capable of simultaneous transmission of a first transmit signal S1 (see FIG. 5) in a first communication band described below and a second transmit signal S2 (see FIG. 5) in a second communication band described below. The combination of the first communication band and the second communication band, for which simultaneous transmission is available, is a combination of frequency bands, which partially overlap each other or do not overlap at all, from among the frequency bands of the communication bands defined in the 3GPP LTE standard and the frequency bands of the communication bands defined in the 5G NR standard. The frequency bands are uplink frequency bands.

The communication device 9 performs communication in multiple communication bands. More specifically, the communication device 9 transmits transmit signals in the respective communication bands, and receives receive signals in the respective communication bands. Specifically, the radio frequency circuit 1 transmits transmit signals in the first communication band and receives receive signals in the first communication band. The radio frequency circuit 1 transmits transmit signals in the second communication band and receives receive signals in the second communication band. The radio frequency circuit 1 transmits transmit signals in a third communication band and receives receive signals in the third communication band. The radio frequency circuit 1 transmits transmit signals in a fourth communication band and receives receive signals in the fourth communication band. The radio frequency circuit 1 transmits transmit signals in a fifth communication band and receives receive signals in the fifth communication band. The radio frequency circuit 1 transmits transmit signals in a sixth communication band and receives receive signals in the sixth communication band. The radio frequency circuit 1 transmits transmit signals in a seventh communication band and receives receive signals in the seventh communication band. The radio frequency circuit 1 transmits transmit signals in an eighth communication band and receives receive signals in the eighth communication band. The radio frequency circuit 1 transmits transmit signals in a ninth communication band and receives receive signals in the ninth communication band.

Some of the transmit signals and the receive signals in multiple communication bands are FDD (Frequency Division Duplex) signals. Transmit signals and receive signals in multiple communication bands are not limited to FDD signals, and may be TDD (Time Division Duplex) signals. FDD is a wireless communication technology in which different frequency bands are assigned to transmission and reception in wireless communication and in which transmission and reception are performed. TDD is a wireless communication technology in which the same frequency band is assigned to transmission and reception in wireless communication and in which transmission and reception are switched on a time basis.

(2) The Circuit Configuration of the Radio Frequency Circuit

The circuit configuration of the radio frequency circuit 1 according to the first embodiment will be described by referring to FIG. 1.

As illustrated in FIG. 1, the radio frequency circuit 1 according to the first embodiment includes multiple (in the illustrated example, two) power amplifiers (a first power amplifier 111 and a second power amplifier 112), multiple (in the illustrated example, nine) transmit filters 121 to 129, multiple (in the illustrated example, nine) receive filters 131 to 139, and multiple (in the illustrated example, two) low-noise amplifiers (a first low-noise amplifier 141 and a second low-noise amplifier 142). The radio frequency circuit 1 according to the first embodiment further includes multiple (in the illustrated example, two) output matching circuits (a first output matching circuit 151 and a second output matching circuit 152), multiple (in the illustrated example, four) input matching circuits 161, 162, 241, and 242, and multiple (in the illustrated example, nine) matching circuits 231 to 239. The radio frequency circuit 1 according to the first embodiment further includes a first switch 17, a second switch 18, a third switch 19, a fourth switch 20, a controller 23, and a phase circuit 25. The radio frequency circuit 1 further includes multiple (in the illustrated example, seven) external connection terminals 10.

(2.1) Power Amplifier

Each of the first power amplifier 111 and the second power amplifier 112 illustrated in FIG. 1 amplifies transmit signals. The first power amplifier 111 is disposed between a signal input terminal 103, which is described below, and the transmit filters 121 to 129. The second power amplifier 112 is disposed between a signal input terminal 104, which is described below, and the transmit filters 121 to 129. Each of the first power amplifier 111 and the second power amplifier 112 has an input terminal (not illustrated) and an output terminal (not illustrated). The first power amplifier 111 is connected, at its input terminal, to an external circuit (for example, a signal processing circuit 92) through the signal input terminal 103. The first power amplifier 111 is connected, at its output terminal, to a common terminal 18A of the second switch 18, and is connectable to the transmit filters 121 to 129 through the second switch 18. That is, the first power amplifier 111 is connectable to the transmit filter 122 (first filter). The second power amplifier 112 is connected, at its input terminal, to an external circuit (for example, the signal processing circuit 92) through the signal input terminal 104. The second power amplifier 112 is connected, at its output terminal, to a common terminal 18B of the second switch 18, and is connectable to the transmit filters 121 to 129 through the second switch 18. That is, the second power amplifier 112 is connectable to the transmit filter 125 (second filter). The first power amplifier 111 and the second power amplifier 112 are controlled, for example, by the controller 23.

The first power amplifier 111 and the second power amplifier 112 support power classes different from each other. "Power class" refers to a classification (User Equipment Power Class) of output power of a terminal (the communication device 9) defined, for example, by using maximum output power. A smaller number described next to "power class" indicates higher output power. For example, the maximum output power (29 dBm) of power class 1 is larger than the maximum output power (26 dBm) of power class 2; the maximum output power (26 dBm) of power class 2 is larger than the maximum output power (23 dBm) of power class 3. The maximum output power is measured, for example, by using a method defined, for example, in 3GPP. The first power amplifier 111 supports a first power class (for example, power class 2); the second power amplifier 112 supports a second power class (for example, power class 3) whose maximum output power is smaller than that of the first power class. That is, in the radio frequency circuit 1 according to the first embodiment, the maximum output power of the first power class is larger than that of the second power class.

(2.2) Transmit Filter

The transmit filters 121 to 129 illustrated in FIG. 1 pass transmit signals in communication bands different from each other. More specifically, the transmit filter 121 passes transmit signals in the third communication band. The transmit filter 122 passes transmit signals in the first communication band. The transmit filter 123 passes transmit signals in the fifth communication band. The transmit filter 124 passes transmit signals in the fourth communication band. The transmit filter 125 passes transmit signals in the second communication band. The transmit filter 126 passes transmit signals in the sixth communication band. The transmit filter 127 passes transmit signals in the seventh communication band. The transmit filter 128 passes transmit signals in the eighth communication band. The transmit filter 129 passes transmit signals in the ninth communication band. In the present embodiment, the transmit filter 122 is the first filter; the transmit filter 125 is the second filter.

The first communication band is, for example, Band 8 according to the 3GPP LTE standard, and the transmit band of the first communication band is 880 MHz to 915 MHZ. The second communication band is, for example, Band 20 according to the 3GPP LTE standard, and the transmit band of the second communication band is 832 MHz to 862 MHz. The third communication band is, for example, Band 5 according to the 3GPP LTE standard, and the transmit band of the third communication band is 824 MHz to 849 MHz. The fourth communication band is, for example, Band 13 according to the 3GPP LTE standard, and the transmit band of the fourth communication band is 777 MHz to 787 MHz. The fifth communication band is, for example, Band 12 according to the 3GPP LTE standard, and the transmit band of the fifth communication band is 699 MHz to 716 MHz. The sixth communication band is, for example, Band 28B according to the 3GPP LTE standard, and the transmit band of the sixth communication band is 718 MHz to 748 MHz. The seventh communication band is, for example, Band 28A according to the 3GPP LTE standard, and the transmit band of the seventh communication band is 703 MHz to 733 MHZ. The eighth communication band is, for example, Band 14 according to the 3GPP LTE standard, and the transmit band of the eighth communication band is 788 MHz to 798 MHz. The ninth communication band is, for example, Band 71 according to the 3GPP LTE standard, and the transmit band of the ninth communication band is 663 MHz to 698 MHZ.

The transmit filters 121 to 129 are disposed between the first power amplifier 111 and the first switch 17. The transmit filters 121 to 129 are disposed between the second power amplifier 112 and the first switch 17. Each of the transmit filters 121 to 129 passes transmit signals in the transmit band of the corresponding communication band from among radio frequency signals having been amplified by either the first power amplifier 111 or the second power amplifier 112. That is, each of the transmit filters 121 to 129 has a passband including the transmit band of the corresponding communication band.

(2.3) Receive Filter

The receive filters 131 to 139 illustrated in FIG. 1 pass receive signals in communication bands different from each other. More specifically, the receive filter 131 passes receive signals in the third communication band. The receive filter 132 passes receive signals in the first communication band. The receive filter 133 passes receive signals in the fifth communication band. The receive filter 134 passes receive signals in the fourth communication band. The receive filter 135 passes receive signals in the second communication band. The receive filter 136 passes receive signals in the sixth communication band. The receive filter 137 passes receive signals in the seventh communication band. The receive filter 138 passes receive signals in the eighth communication band. The receive filter 139 passes receive signals in the ninth communication band. In the present embodiment, the receive filter 132 is a third filter.

The receive band of the first communication band is 925 MHz to 960 MHz. The receive band of the second communication band is 791 MHz to 821 MHz. The receive band of the third communication band is 869 MHz to 894 MHZ. The receive band of the fourth communication band is 746 MHz to 756 MHz. The receive band of the fifth communication band is 729 MHz to 746 MHz. The receive band of the sixth communication band is 773 MHz to 803 MHz. The receive band of the seventh communication band is 758 MHz to 788 MHz. The receive band of the eighth communication band is 758 MHz to 768 MHz. The receive band of the ninth communication band is 617 MHz to 652 MHz.

The receive filters 131 to 139 are disposed between the first low-noise amplifier 141 and the first switch 17. The receive filters 131 to 139 are disposed between the second low-noise amplifier 142 and the first switch 17. Each of the receive filters 131 to 139 passes receive signals in the receive band of the corresponding communication band from among radio frequency signals which are input from antenna terminals 101 and 102 described below. That is, each of the receive filters 131 to 139 has a passband including the receive band of the corresponding communication band.

In the present embodiment, the transmit filter 121 and the receive filter 131 form a duplexer 31; the transmit filter 122 and the receive filter 132 form a duplexer 32; the transmit filter 123 and the receive filter 133 form a duplexer 33. In the present embodiment, the transmit filter 124 and the receive filter 134 form a duplexer 34; the transmit filter 125 and the receive filter 135 form a duplexer 35; the transmit filter 126 and the receive filter 136 form a duplexer 36. In the present embodiment, the transmit filter 127 and the receive filter 137 form a duplexer 37; the transmit filter 128 and the receive filter 138 form a duplexer 38; the transmit filter 129 and the receive filter 139 form a duplexer 39.

(2.4) Low-Noise Amplifier

Each of the first low-noise amplifier 141 and the second low-noise amplifier 142 illustrated in FIG. 1 amplifies receive signals with low noise. The first low-noise amplifier 141 is disposed between a signal output terminal 105, which is described below, and the receive filters 131 to 139. The second low-noise amplifier 142 is disposed between a signal output terminal 106, which is described below, and the receive filters 131 to 139. Each of the first low-noise amplifier 141 and the second low-noise amplifier 142 has an input terminal (not illustrated) and an output terminal (not illustrated). The first low-noise amplifier 141 is connected, at its input terminal, to the input matching circuit 161. The first low-noise amplifier 141 is connected, at its output terminal, to an external circuit (for example, the signal processing circuit 92) through the signal output terminal 105. The second low-noise amplifier 142 is connected, at its input terminal, to the input matching circuit 162. The second low-noise amplifier 142 is connected, at its output terminal, to an external circuit (for example, the signal processing circuit 92) through the signal output terminal 106.

(2.5) Output Matching Circuit

As illustrated in FIG. 1, the first output matching circuit 151 is disposed between the first power amplifier 111 and the transmit filters 121 to 129. More specifically, the first output matching circuit 151 is connected between the first power amplifier 111 and the common terminal 18A (first terminal) of the second switch 18. The first output matching circuit 151 is a circuit for impedance matching between the first power amplifier 111 and the transmit filters 121 to 129.

Figure 6:
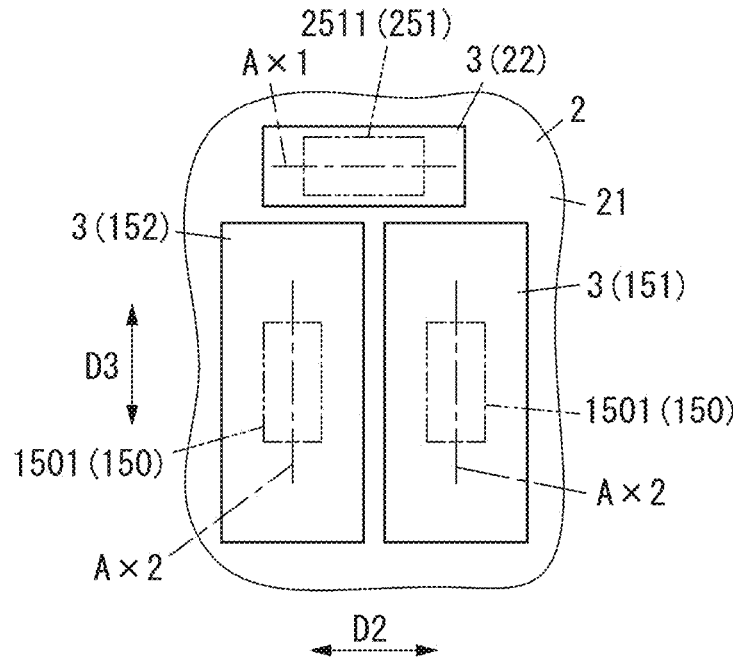
FIG. 6 is a plan view of a principal part of the radio frequency circuit.

The first output matching circuit 151 includes, for example, a single inductor 150 (see FIG. 6). The inductor 150 of the first output matching circuit 151 is disposed on the output side of the first power amplifier 111. The first output matching circuit 151 is not limited to the configuration including a single inductor 150. For example, the first output matching circuit 151 may have a configuration including multiple inductors, or may have a configuration including multiple inductors and multiple capacitors.

As illustrated in FIG. 1, the second output matching circuit 152 is disposed between the second power amplifier 112 and the transmit filters 121 to 129. More specifically, the second output matching circuit 152 is connected between the second power amplifier 112 and the common terminal 18B (second terminal) of the second switch 18. The second output matching circuit 152 is a circuit for impedance matching between the second power amplifier 112 and the transmit filters 121 to 129.

Like the first output matching circuit 151, the second output matching circuit 152 includes a single inductor 150 (see FIG. 6). The inductor 150 of the second output matching circuit 152 is disposed on the output side of the second power amplifier 112. The second output matching circuit 152 is not limited to the configuration including a single inductor 150. For example, the second output matching circuit 152 may have a configuration including multiple inductors, or may have a configuration including multiple inductors and multiple capacitors.

(2.6) Input Matching Circuit

As illustrated in FIG. 1, the input matching circuit 161 is disposed between the receive filters 131 and 132 and the first low-noise amplifier 141. The input matching circuit 161 is a circuit for impedance matching between the receive filters 131 and 132 and the first low-noise amplifier 141.

The input matching circuit 161 includes an inductor. The inductor of the input matching circuit 161 is disposed on the input side of the first low-noise amplifier 141. The input matching circuit 161 is not limited to the configuration including a single inductor. For example, the input matching circuit 161 may have a configuration including multiple inductors, or may have a configuration including multiple inductors and multiple capacitors.

As illustrated in FIG. 1, the input matching circuit 162 is disposed between the receive filters 133 to 139 and the second low-noise amplifier 142. The input matching circuit 162 is a circuit for impedance matching between the receive filters 133 to 139 and the second low-noise amplifier 142.

The input matching circuit 162 includes an inductor. The inductor of the input matching circuit 162 is disposed on the input side of the second low-noise amplifier 142. The input matching circuit 162 is not limited to the configuration including a single inductor. For example, the input matching circuit 162 may have a configuration including multiple inductors, or may have a configuration including multiple inductors and multiple capacitors.

As illustrated in FIG. 1, the input matching circuit 241 is disposed between the signal input terminal 103 and the first power amplifier 111. The input matching circuit 241 is a circuit for impedance matching between the signal processing circuit 92 and the first power amplifier 111.

The input matching circuit 241 includes an inductor. The inductor of the input matching circuit 241 is disposed on the input side of the first power amplifier 111. The input matching circuit 241 is not limited to the configuration including a single inductor. For example, the input matching circuit 241 may have a configuration including multiple inductors, or may have a configuration including multiple inductors and multiple capacitors.

As illustrated in FIG. 1, the input matching circuit 242 is disposed between the signal input terminal 104 and the second power amplifier 112. The input matching circuit 242 is a circuit for impedance matching between the signal processing circuit 92 and the second power amplifier 112.

The input matching circuit 242 includes an inductor. The inductor of the input matching circuit 242 is disposed on the input side of the second power amplifier 112. The input matching circuit 242 is not limited to the configuration including a single inductor. For example, the input matching circuit 242 may have a configuration including multiple inductors, or may have a configuration including multiple inductors and multiple capacitors.

(2.7) Matching Circuit

As illustrated in FIG. 1, the matching circuits 231 to 239 correspond to the duplexers 31 to 39. Each of the matching circuits 231 to 239 is disposed between the corresponding duplexer and the first switch 17. Each of the matching circuits 231 to 239 is a circuit for impedance matching between the corresponding duplexer and the first switch 17. Each of the matching circuits 231 to 239 is, for example, an inductor. More specifically, each of the matching circuits 231 to 239 is a chip inductor.

(2.8) First Switch

The first switch 17 illustrated in FIG. 1 switches to transmit filters, which are to be connected to the antenna terminals 101 and 102, from among the transmit filters 121 to 129. The first switch 17 switches to receive filters, which are to be connected to the antenna terminals 101 and 102, from among the receive filters 131 to 139. That is, the first switch 17 is a switch for switching paths connecting to multiple antennas 911 and 912. The first switch 17 has multiple (in the illustrated example, two) common terminals 17A and 17B and multiple (in the illustrated example, nine) selection terminals 171 to 179. The common terminal 17A is connected to the antenna terminal 101. The common terminal 17B is connected to the antenna terminal 102.

The selection terminal 171 is connected to the duplexer 31 (the transmit filter 121 and the receive filter 131). The selection terminal 172 is connected to the duplexer 32 (the transmit filter 122 and the receive filter 132). The selection terminal 173 is connected to the duplexer 33 (the transmit filter 123 and the receive filter 133). The selection terminal 174 is connected to the duplexer 34 (the transmit filter 124 and the receive filter 134). The selection terminal 175 is connected to the duplexer 35 (the transmit filter 125 and the receive filter 135). The selection terminal 176 is connected to the duplexer 36 (the transmit filter 126 and the receive filter 136). The selection terminal 177 is connected to the duplexer 37 (the transmit filter 127 and the receive filter 137). The selection terminal 178 is connected to the duplexer 38 (the transmit filter 128 and the receive filter 138). The selection terminal 179 is connected to the duplexer 39 (the transmit filter 129 and the receive filter 139).

The first switch 17 switches the connection state between the common terminals 17A and 17B and the selection terminals 171 to 179. The first switch 17 is controlled, for example, by the signal processing circuit 92. The first switch 17 electrically connects the common terminal 17A to at least one of the selection terminals 171 to 179 in accordance with a control signal from an RF signal processing circuit 93 of the signal processing circuit 92. The first switch 17 electrically connects the common terminal 17B to at least one of the selection terminals 171 to 179 in accordance with a control signal from the RF signal processing circuit 93 of the signal processing circuit 92.

(2.9) Second Switch

The second switch (switch) 18 illustrated in FIG. 1 switches to transmit filters, which are to be connected to the first power amplifier 111 and the second power amplifier 112, from among the transmit filters 121 to 129. That is, the second switch 18 is a switch for switching paths connecting to the first power amplifier 111 and the second power amplifier 112. The second switch 18 has the multiple (in the illustrated example, two) common terminals 18A and 18B and multiple (in the illustrated example, ten) selection terminals 180 to 189. The common terminal 18A is connected to the first power amplifier 111. The common terminal 18B is connected to the second power amplifier 112. In the present embodiment, the common terminal 18A is the first terminal; the common terminal 18B is the second terminal.

The selection terminal 180 is connected to the phase circuit 25. The selection terminal 181 is connected to the transmit filter 121. The selection terminal 182 is connected to the transmit filter 122. The selection terminal 183 is connected to the transmit filter 123. The selection terminal 184 is connected to the transmit filter 124. The selection terminal 185 is connected to the transmit filter 125. The selection terminal 186 is connected to the transmit filter 126. The selection terminal 187 is connected to the transmit filter 127. The selection terminal 188 is connected to the transmit filter 128. The selection terminal 189 is connected to the transmit filter 129. In the present embodiment, the selection terminal 180 is a third terminal; the selection terminal 182 is a fourth terminal; the selection terminal 185 is a fifth terminal. That is, the second switch 18 has the first terminal (common terminal 18A), the second terminal (common terminal 18B), the third terminal (selection terminal 180), the fourth terminal (selection terminal 182), and the fifth terminal (selection terminal 185).

The second switch 18 switches the connection state between the common terminals 18A and 18B and the selection terminals 180 to 189. The second switch 18 is controlled, for example, by the signal processing circuit 92. The second switch 18 electrically connects the common terminal 18A to at least one of the selection terminals 180 to 189 in accordance with a control signal from the RF signal processing circuit 93 of the signal processing circuit 92. The second switch 18 electrically connects the common terminal 18B to at least one of the selection terminals 180 to 189 in accordance with a control signal from the RF signal processing circuit 93 of the signal processing circuit 92.

(2.10) Third Switch

The third switch 19 illustrated in FIG. 1 switches to at least one receive filter, which is to be connected to the first low-noise amplifier 141, from among the receive filters 131 and 132. That is, the third switch 19 is a switch for switching at least one path connecting to the first low-noise amplifier 141. The third switch 19 has a common terminal 190 and multiple (in the illustrated example, three) selection terminals 191 to 193. The common terminal 190 is connected to the first low-noise amplifier 141. The selection terminal 191 is connected to the receive filter 131. The selection terminal 192 is connected to the receive filter 132.

The third switch 19 switches the connection state between the common terminal 190 and the selection terminals 191 to 193. The third switch 19 is controlled, for example, by the signal processing circuit 92. The third switch 19 electrically connects the common terminal 190 to at least one of the selection terminals 191 to 193 in accordance with a control signal from the RF signal processing circuit 93 of the signal processing circuit 92.

(2.11) Fourth Switch

The fourth switch 20 illustrated in FIG. 1 switches to at least one receive filter, which is to be connected to the second low-noise amplifier 142, from among the receive filters 133 to 139. That is, the fourth switch 20 is a switch for switching at least one path connecting to the second low-noise amplifier 142. The fourth switch 20 has a common terminal 200 and multiple (in the illustrated example, seven) selection terminals 201 to 207. The common terminal 200 is connected to the second low-noise amplifier 142.

The selection terminal 201 is connected to the receive filter 133. The selection terminal 202 is connected to the receive filter 134. The selection terminal 203 is connected to the receive filter 135. The selection terminal 204 is connected to the receive filter 136. The selection terminal 205 is connected to the receive filter 137. The selection terminal 206 is connected to the receive filter 138. The selection terminal 207 is connected to the receive filter 139.

The fourth switch 20 switches the connection state between the common terminal 200 and the selection terminals 201 to 207. The fourth switch 20 is controlled, for example, by the signal processing circuit 92. The fourth switch 20 electrically connects the common terminal 200 to at least one of the selection terminals 201 to 207 in accordance with a control signal from the RF signal processing circuit 93 of the signal processing circuit 92.

(2.12) Controller

The controller 23 controls the first power amplifier 111 and the second power amplifier 112, for example, in accordance with control signals from the signal processing circuit 92. The controller 23 is connected to the first power amplifier 111 and the second power amplifier 112. The controller 23 is connected to the signal processing circuit 92 through multiple (for example, four) control terminals 107. The control terminals 107 are terminals for inputting control signals from an external circuit (for example, the signal processing circuit 92) to the controller 23. The controller 23 controls the first power amplifier 111 and the second power amplifier 112 on the basis of the control signals obtained through the control terminals 107. The control signals obtained by the controller 23 through the control terminals 107 are digital signals. The number of control terminals 107 is, for example, four. FIG. 1 illustrates one control terminal 107.

(2.13) Phase Circuit

The phase circuit (circuit) 25 is a circuit for changing the phase of one of the following transmit signals: the first transmit signal S1 (see FIG. 5) which passes through the first power amplifier 111; the second transmit signal S2 (see FIG. 5) which passes through the second power amplifier 112. In the radio frequency circuit 1 according to the first embodiment, the phase circuit 25 is connected to the selection terminal 180 of the second switch 18. Therefore, in the radio frequency circuit 1 according to the first embodiment, the common terminal 18B of the second switch 18 is connected to the selection terminal 180 so that the phase circuit 25 changes the phase of the second transmit signal S2 which passes through the second power amplifier 112. The phase circuit 25 changes the phase of the second transmit signal S2, which passes through the second power amplifier 112, so that the leakage signal of the second transmit signal S2, which leaks to the signal path through which the first transmit signal S1 flows, is made small. More specifically, the phase circuit 25 changes the phase of the second transmit signal S2 so that the absolute value of the phase difference between an input-side leakage signal and an output-side leakage signal of the second transmit signal S2, which leak to the signal path through which the first transmit signal S1 flows, is greater than or equal to 90° and less than or equal to 180°. More preferably, the phase circuit 25 may change the phase of the second transmit signal S2 so that the absolute value of the phase difference between an input-side leakage signal and an output-side leakage signal of the second transmit signal S2, which are applied to the first power amplifier 111, is greater than or equal to 135° and less than or equal to 180°. An input-side leakage signal of the second transmit signal S2 is a leakage signal which flows to the input side of the first power amplifier 111 in the signal path through which the first transmit signal S1 flows. An output-side leakage signal of the second transmit signal S2 is a leakage signal which flows to the output side of the first power amplifier 111 in the signal path through which the first transmit signal S1 flows.

Figure 5:
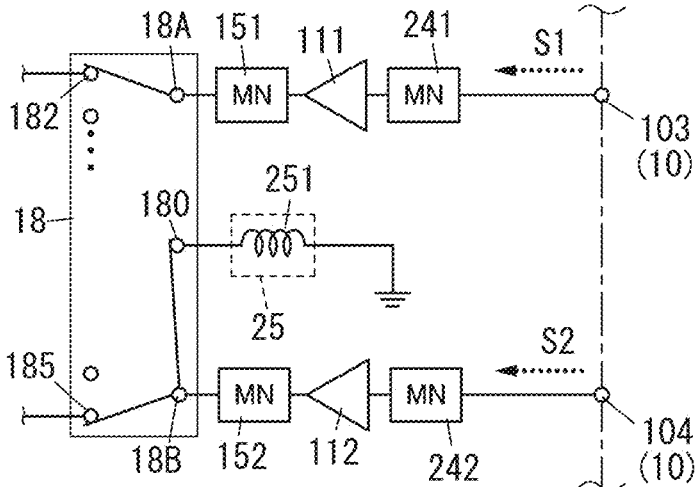
FIG. 5 is a diagram illustrating the circuit configuration of a principal part of the radio frequency circuit.

As illustrated in FIG. 5, the phase circuit 25 includes an inductor 251. The inductor 251 of the phase circuit 25 is connected between the selection terminal 180 of the second switch 18 and the ground. In the second switch 18, for example, when two-uplink carrier aggregation is performed by using the transmit filter 122 and the transmit filter 125, the common terminal 18B is connected to the selection terminal 180 and the selection terminal 185. In this case, the inductor 251 of the phase circuit 25 is connected (shunt-connected) between the ground and the signal path between the second power amplifier 112 and the transmit filter 125 (see FIG. 1).

In the radio frequency circuit 1 according to the first embodiment, when only the second transmit signal S2 is transmitted, the common terminal 18B of the second switch 18 is not connected to the selection terminal 180. That is, in this case, the phase circuit 25 is detached from the signal path including the second power amplifier 112. This enables suppression of signal loss (loss) of the second transmit signal S2.

(2.14) External Connection Terminal

As illustrated in FIG. 1, the external connection terminals 10 are terminals for electrically connecting the radio frequency circuit 1 to external circuits (for example, the signal processing circuit 92). The external connection terminals 10 include the multiple (in the illustrated example, two) antenna terminals 101 and 102, the multiple (in the illustrated example, two) signal input terminals 103 and 104, the multiple (in the illustrated example, two) signal output terminals 105 and 106, the multiple (only one in FIG. 1) control terminals 107, and multiple ground terminals 108 (see FIG. 3).

The antenna terminal 101 is connected to the antenna 911. The antenna terminal 102 is connected to the antenna 912. In the radio frequency circuit 1, the antenna terminals 101 and 102 are connected to the first switch 17. The antenna terminals 101 and 102 are connected to the transmit filters 121 to 129 and the receive filters 131 to 139 through the first switch 17.

The signal input terminals 103 and 104 are terminals for inputting transmit signals (for example, the first transmit signal S1 and the second transmit signal S2), which are from an external circuit (for example, the signal processing circuit 92), to the radio frequency circuit 1. In the radio frequency circuit 1, the signal input terminal 103 is connected to the first power amplifier 111 through the input matching circuit 241. In the radio frequency circuit 1, the signal input terminal 104 is connected to the second power amplifier 112 through the input matching circuit 242.

The signal output terminal 105 is a terminal for outputting receive signals, which are from the first low-noise amplifier 141, to an external circuit (for example, the signal processing circuit 92). The signal output terminal 106 is a terminal for outputting receive signals, which are from the second low-noise amplifier 142, to an external circuit (for example, the signal processing circuit 92). In the radio frequency circuit 1, the signal output terminal 105 is connected to the first low-noise amplifier 141. In the radio frequency circuit 1, the signal output terminal 106 is connected to the second low-noise amplifier 142.

The control terminals 107 are terminals for inputting control signals, which are from an external circuit (for example, the signal processing circuit 92), to the radio frequency circuit 1. In the radio frequency circuit 1, the control terminals 107 are connected to the controller 23.

The ground terminals 108 (see FIG. 3) are terminals which are electrically connected to ground electrodes of an external substrate (not illustrated), which is included in the communication device 9, so as to be supplied with the ground potential. In the radio frequency circuit 1, the ground terminals 108 are connected to a ground layer (not illustrated) of a mount substrate 2 described below.

(3) The Structure of the Radio Frequency Circuit (Radio Frequency Module)

Figure 2:
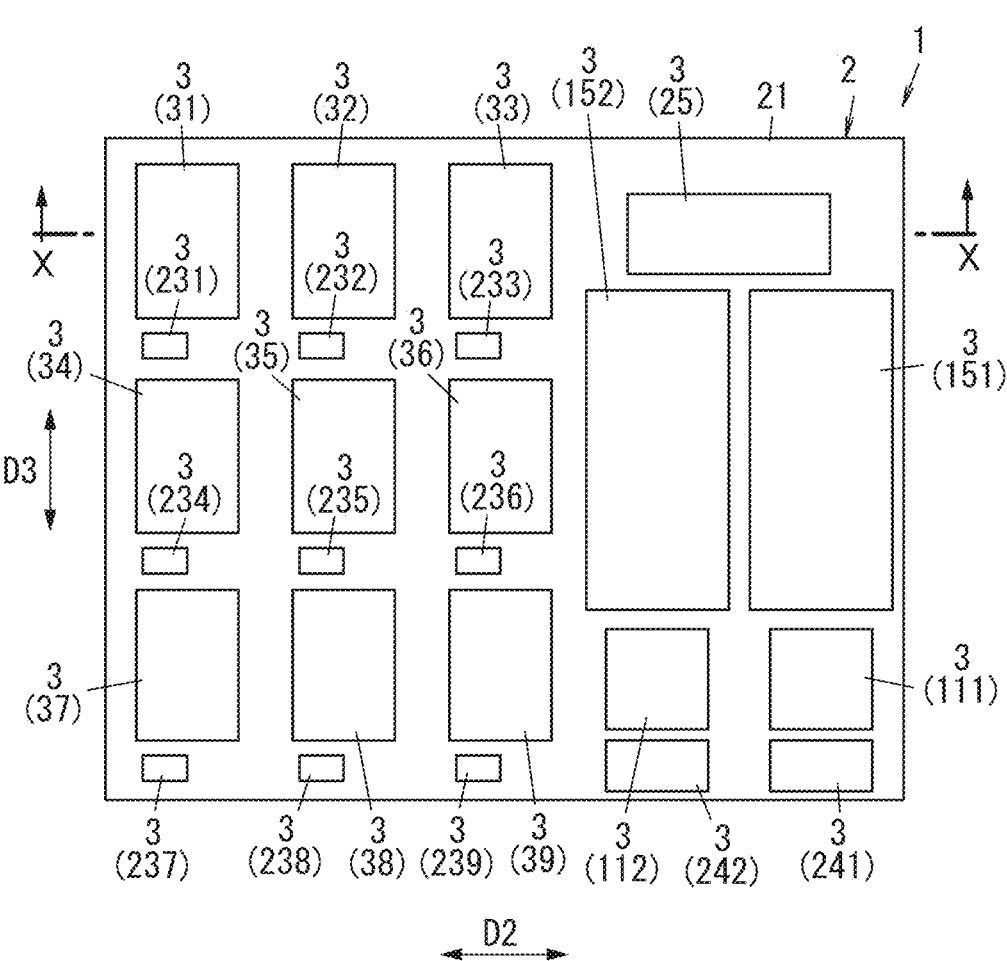
FIG. 2 is a plan view of the radio frequency circuit.
Figure 3:
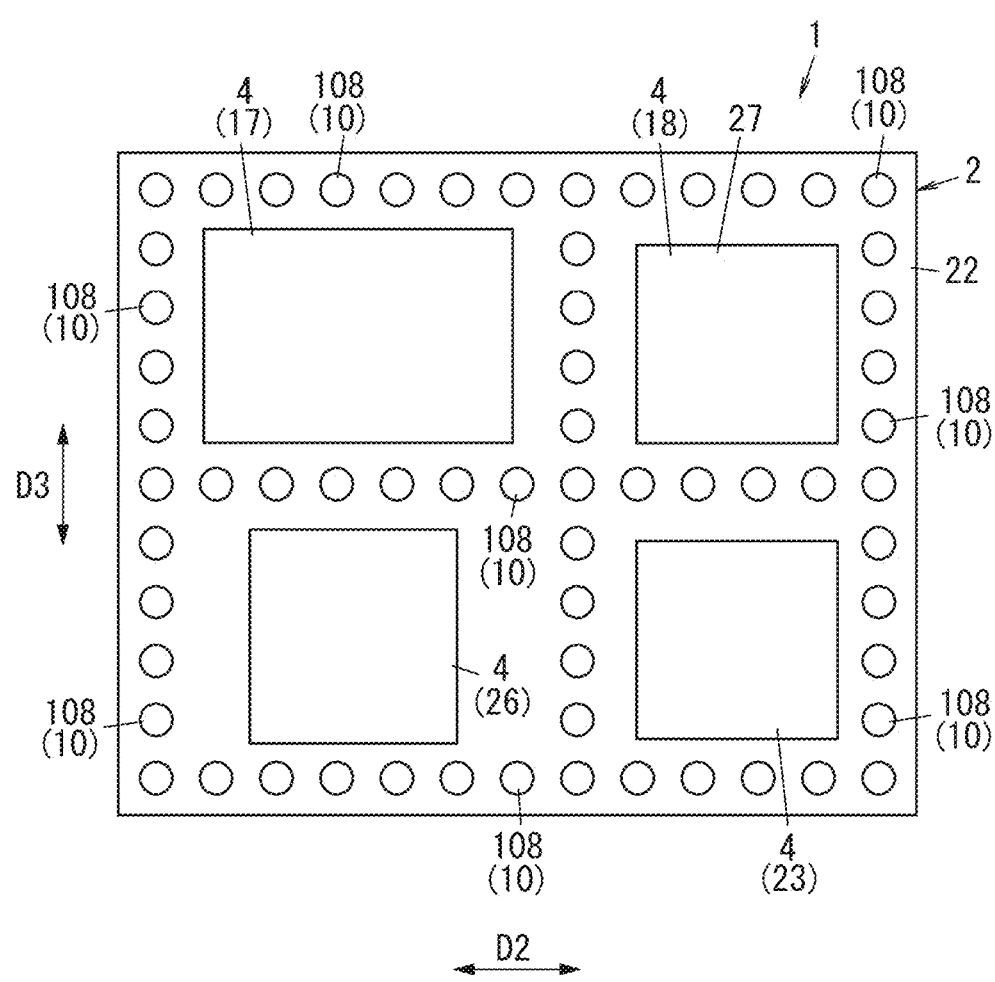
FIG. 3 is a plan view of the radio frequency circuit, which is obtained when a second principal surface of a mount substrate as well as multiple electronic components and multiple external connection terminals, which are disposed on the second principal surface of the mount substrate, are seen through from the first principal surface side of the mount substrate.
Figure 4:
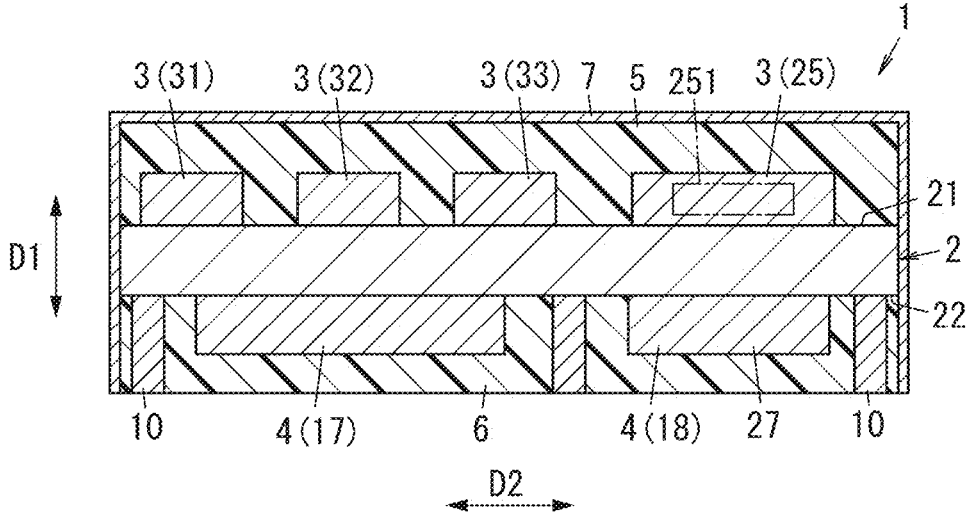
FIG. 4 is a cross-sectional view, along line X-X in FIG. 2, of the radio frequency circuit.

As illustrated in FIGS. 2 to 4, the radio frequency circuit 1 according to the first embodiment includes the mount substrate 2. In the description below, the radio frequency circuit 1 including the mount substrate 2 may be referred to as the "radio frequency module 1". The structure of the radio frequency module 1 according to the first embodiment will be described below by referring to FIGS. 2 to 4.

As illustrated in FIGS. 2 to 4, the radio frequency module 1 includes the mount substrate 2, multiple (in the illustrated example, 25) first electronic components 3, multiple (in the illustrated example, four) second electronic components 4, and the external connection terminals 10. The radio frequency module 1 further includes a first resin layer 5, a second resin layer 6, and a metal layer 7.

The radio frequency module 1 is electrically connectable to an external substrate (not illustrated). The external substrate corresponds to, for example, a mother board of the communication device 9 (see FIG. 1), such as a cellular phone or a communication device. The state in which the radio frequency module 1 is electrically connectable to an external substrate encompasses, not only the case in which the radio frequency module 1 is mounted directly on the external substrate, but also the case in which the radio frequency module 1 is mounted indirectly on the external substrate. The case in which the radio frequency module 1 is mounted indirectly on the external substrate is, for example, the case in which the radio frequency module 1 is mounted on a different radio frequency module mounted on the external substrate.

(3.1) Mount Substrate

As illustrated in FIGS. 2 to 4, the mount substrate 2 has a first principal surface 21 and a second principal surface 22.

The first principal surface 21 and the second principal surface 22 are opposite each other in the thickness direction D1 of the mount substrate 2. When the radio frequency module 1 is disposed on an external substrate, the second principal surface 22 is opposite the external substrate's principal surface located on the mount substrate 2 side. The mount substrate 2 is a double-sided mount substrate, on which the first electronic components 3 are mounted on the first principal surface 21 and the second electronic components 4 are mounted on the second principal surface 22. In the present embodiment, the thickness direction D1 of the mount substrate 2 is a first direction (hereinafter also referred to as a "first direction D1").

The mount substrate 2 is a multilayer substrate having multiple laminated dielectric layers. The mount substrate 2 has multiple conductive layers and multiple via conductors (including through electrodes). The conductive layers include a ground layer having the ground potential. The via conductors are used for electrical connection between conductive layers of the mount substrate 2 and devices (including the first electronic components 3 and the second electronic components 4 described above) mounted on the first principal surface 21 and the second principal surface 22. The via conductors are used for electrical connection between devices, which are mounted on the first principal surface 21, and devices, which are mounted on the second principal surface 22, and for electrical connection between the conductive layers of the mount substrate 2 and the external connection terminals 10.

The first electronic components 3 are disposed on the first principal surface 21 of the mount substrate 2. The second electronic components 4 and the external connection terminals 10 are disposed on the second principal surface 22 of the mount substrate 2.

(3.2) First Electronic Component

As illustrated in FIG. 2, the first electronic components 3 are disposed on the first principal surface 21 of the mount substrate 2. In the example in FIG. 2, the first electronic components 3 are mounted on the first principal surface 21 of the mount substrate 2. A part of each first electronic component 3 may be mounted on the first principal surface 21 of the mount substrate 2, and the remainder may be embedded in the mount substrate 2. In short, each of the first electronic components 3 is positioned closer to the first principal surface 21 side than the second principal surface 22 of the mount substrate 2, and has at least a part mounted on the first principal surface 21. As illustrated in FIG. 2, each of the first electronic components 3 is any of the following components: the duplexers 31 to 39; the matching circuits 231 to 239; the power amplifiers (the first power amplifier 111 and the second power amplifier 112); the output matching circuits (the first output matching circuit 151 and the second output matching circuit 152); the input matching circuits 241 and 242; and the phase circuit 25.

Each of the transmit filters 121 to 129 and the receive filters 131 to 139 is, for example, an acoustic-wave filter including multiple serial arm resonators and multiple parallel arm resonators. The acoustic-wave filter is, for example, a SAW (Surface Acoustic Wave) filter using surface acoustic waves. Each of the transmit filters 121 to 129 and the receive filters 131 to 139 may include either one or both of an inductor and a capacitor which are connected in series to any of the serial arm resonators, or may include an inductor or a capacitor which is connected in series to any of the parallel arm resonators.

(3.3) Second Electronic Component

As illustrated in FIG. 3, the second electronic components 4 are disposed on the second principal surface 22 of the mount substrate 2. In the example in FIG. 3, the second electronic components 4 are mounted on the second principal surface 22 of the mount substrate 2. A part of each second electronic component 4 may be mounted on the second principal surface 22 of the mount substrate 2, and the remainder may be embedded in the mount substrate 2. In short, each of the second electronic component 4 is positioned closer to the second principal surface 22 side than the first principal surface 21 of the mount substrate 2, and has at least a part mounted on the second principal surface 22. Each of the second electronic components 4 is any of the following devices: the first switch 17; the controller 23; a first IC chip 26; and a second IC chip 27.

(3.4) External Connection Terminal

The external connection terminals 10 are terminals for electrically connecting the mount substrate 2 to an external substrate (not illustrated).

As illustrated in FIGS. 3 and 4, the external connection terminals 10 are disposed on the second principal surface 22 of the mount substrate 2. The external connection terminals 10 are columnar (for example, cylindrical) electrodes disposed on the second principal surface 22 of the mount substrate 2. The material of the external connection terminals 10 is, for example, metal (for example, copper or copper alloy).

(3.5) First Resin Layer

As illustrated in FIG. 4, the first resin layer 5 is disposed on the first principal surface 21 of the mount substrate 2. The first resin layer 5 covers the first electronic components 3. More specifically, the first resin layer 5 covers the periphery of each of the first electronic components 3. The first resin layer 5 covers the principal surface which is on the side opposite to the mount substrate 2 side of each of the first electronic components 3. In the present embodiment, the periphery of each of the first electronic components 3 includes four side surfaces which connect the principal surface, which is on the side opposite to the mount substrate 2 side, of the first electronic component 3 to the principal surface on the mount substrate 2 side. The first resin layer 5 contains resin (for example, epoxy resin). The first resin layer 5 may contain a filler in addition to resin.

(3.6) Second Resin Layer

As illustrated in FIG. 4, the second resin layer 6 is disposed on the second principal surface 22 of the mount substrate 2. The second resin layer 6 covers the second electronic components 4 and the external connection terminals 10. More specifically, the second resin layer 6 covers the periphery of each of the second electronic components 4 and the periphery of each of the external connection terminals 10. The second resin layer 6 covers the principal surface which is on the side opposite to the mount substrate 2 side of each of the second electronic components 4. In the present embodiment, the periphery of each of the second electronic components 4 includes four side surfaces which connect the principal surface, which is on the side opposite to the mount substrate 2 side, of the second electronic component 4 to the principal surface on the mount substrate 2 side. The second resin layer 6 contains resin (for example, epoxy resin). The second resin layer 6 may contain a filler in addition to resin. The material of the second resin layer 6 may be the same as that of the first resin layer 5, or may be a different material.

(3.7) Metal Layer

As illustrated in FIG. 4, the metal layer 7 covers the first resin layer 5. The metal layer 7 is conductive. In the radio frequency module 1, the metal layer 7 is a shield layer disposed in order to achieve electromagnetic shielding between the inside and the outside the radio frequency module 1. The metal layer 7 has a multilayer structure of multiple laminated metal layers. However, the structure of the metal layer 7 is not limited to a multilayer structure, and may be a single metal layer. The single metal layer contains one or more types of metal. The metal layer 7 covers the principal surface, which is on the side opposite to the mount substrate 2 side, of the first resin layer 5, the periphery of the first resin layer 5, the periphery of the mount substrate 2, and the periphery of the second resin layer 6. The metal layer 7 is in contact with at least a part of the periphery of the ground layer of the mount substrate 2. This enables the potential of the metal layer 7 to be the same as that of the ground layer.

(4) The Detailed Structure of Each Component of the Radio Frequency Circuit (Radio Frequency Module)

(4.1) Mount Substrate

The mount substrate 2 illustrated in FIGS. 2 to 4 is, for example, a multilayer substrate including multiple dielectric layers and multiple conductive layers. The dielectric layers and the conductive layers are laminated in the thickness direction D1 of the mount substrate 2. The conductive layers are formed in predetermined patterns defined for the respective layers. Each of the conductive layers includes one or more conductor units in a plane orthogonal to the thickness direction D1 of the mount substrate 2. The material of the conductive layers is, for example, copper. The conductive layers include a ground layer. In the radio frequency module 1, multiple ground terminals are electrically connected to the ground layer, for example, through via conductors of the mount substrate 2. The mount substrate 2 is, for example, an LTCC (LOW Temperature Co-fired Ceramics) substrate. The mount substrate 2 is not limited to an LTCC substrate, and may be, for example, a printed wiring board, an HTCC (High Temperature Co-fired Ceramics) substrate, or a resin multilayer substrate.

The mount substrate 2 is not limited to an LTCC substrate, and may be, for example, a wiring structure. The wiring structure is, for example, a multilayer structure. The multilayer structure includes at least one insulating layer and at least one conductive layer. The insulating layer is formed in a predetermined pattern. In the case of multiple insulating layers, the insulating layers are formed in predetermined patterns defined for the respective layers. The conductive layer is formed in a predetermined pattern different from that of the insulating layer. In the case of multiple conductive layers, the conductive layers are formed in predetermined patterns defined for the respective layers. The conductive layer may include one or more redistribution units. In the wiring structure, a first surface among the two surfaces which are opposite each other in the thickness direction of the multilayer structure is the first principal surface 21 of the mount substrate 2; a second surface is the second principal surface 22 of the mount substrate 2. The wiring structure may be, for example, an interposer. The interposer may be an interposer using a silicon substrate or may be a substrate having multiple layers.

The first principal surface 21 and the second principal surface 22 of the mount substrate 2 are separated from each other in the thickness direction D1 of the mount substrate 2, and intersect the thickness direction D1 of the mount substrate 2. The first principal surface 21 of the mount substrate 2 is orthogonal, for example, to the thickness direction D1 of the mount substrate 2. Alternatively, the first principal surface 21 may include, for example, a side surface of a conductor unit as a surface which is not orthogonal to the thickness direction D1 of the mount substrate 2. The second principal surface 22 of the mount substrate 2 is orthogonal, for example, to the thickness direction D1 of the mount substrate 2. Alternatively, the second principal surface 22 may include, for example, a side surface of a conductor unit as a surface which is not orthogonal to the thickness direction D1 of the mount substrate 2. The first principal surface 21 and the second principal surface 22 of the mount substrate 2 may have minute unevenness, projections, or depressions formed thereon.

(4.2) Filter

The detailed structure of the duplexers 31 to 39 illustrated in FIG. 2 will be described. In the description below, the duplexers 31 to 39 are not distinguished from each other and are referred to as duplexers.

The first electronic components 3, which form the respective duplexers, each include, for example, a substrate and a circuit unit formed on the substrate. The substrate has a first surface and a second surface which are opposite each other in the thickness direction of the substrate. The substrate is, for example, a piezoelectric substrate. The piezoelectric substrate is, for example, a lithium niobate substrate, a lithium tantalate substrate, or a quartz substrate. The circuit unit has multiple IDT (Interdigital Transducer) electrodes corresponding one to one to the serial arm resonators, and multiple IDT electrodes corresponding one to one to the parallel arm resonators. For example, the first electronic components 3, which form the respective duplexers, are flip-chip mounted on the first principal surface 21 of the mount substrate 2 so that the first surfaces of the substrates are positioned on the first principal surface 21 side of the mount substrate 2. In plan view in the thickness direction D1 of the mount substrate 2, the outer edges of each of the first electronic component 3, which form the respective duplexers, have a rectangular shape.

(4.3) Power Amplifier

The first electronic components 3, which form the first power amplifier 111 and the second power amplifier 112 respectively, are, for example, single-chip ICs each including a substrate and a circuit unit. The substrate has a first surface and a second surface which are opposite each other in the thickness direction of the substrate. The substrate is, for example, a gallium arsenide substrate. The circuit unit includes at least one transistor formed on the first surface of the substrate. The circuit unit has a function of amplifying transmit signals received by the first power amplifier 111 or the second power amplifier 112. The transistor is, for example, an HBT (Heterojunction Bipolar Transistor). Each of the first power amplifier 111 and the second power amplifier 112 may include, for example, a capacitor for cutting direct current. For example, the IC chips, which form the first power amplifier 111 and the second power amplifier 112 respectively, are flip-chip mounted on the first principal surface 21 of the mount substrate 2 so that the first surfaces of the substrates are positioned on the first principal surface 21 side of the mount substrate 2. In plan view in the thickness direction D1 of the mount substrate 2, the outer edges of each of the IC chips, which form the first power amplifier 111 and the second power amplifier 112 respectively, have a rectangular shape.

(4.4) Output Matching Circuit

The first electronic components 3, which form the first output matching circuit 151 and the second output matching circuit 152 respectively, are, for example, chip inductors. The first electronic components 3, which form the first output matching circuit 151 and the second output matching circuit 152 respectively, are mounted, for example, on the first principal surface 21 of the mount substrate 2. In plan view in the thickness direction D1 of the mount substrate 2, the outer edges of each of the first electronic components 3, which form the first output matching circuit 151 and the second output matching circuit 152 respectively, have a rectangular shape.

(4.5) Input Matching Circuit

The first electronic components 3, which form the respective input matching circuits 241 and 242, are, for example, chip inductors. The first electronic components 3, which form the respective input matching circuits 241 and 242, are mounted, for example, on the first principal surface 21 of the mount substrate 2. In plan view in the thickness direction D1 of the mount substrate 2, the outer edges of each of the first electronic components 3, which form the respective input matching circuits 241 and 242, have a rectangular shape.

(4.6) Matching Circuit

The first electronic components 3, which form the respective matching circuits 231 to 239, are, for example, chip inductors. The first electronic components 3, which form the respective matching circuits 231 to 239, are mounted, for example, on the first principal surface 21 of the mount substrate 2. In plan view in the thickness direction D1 of the mount substrate 2, the outer edges of each of the first electronic components 3, which form the respective matching circuits 231 to 239, have a rectangular shape.

(4.7) Phase Circuit

The first electronic component 3, which forms the phase circuit 25, is, for example, a chip inductor. The first electronic component 3, which forms the phase circuit 25, is mounted, for example, on the first principal surface 21 of the mount substrate 2. In plan view in the thickness direction D1 of the mount substrate 2, the outer edges of the first electronic component 3, which forms the phase circuit 25, have a rectangular shape.

(4.8) First Switch

The first electronic component 3, which forms the first switch 17, is, for example, a single-chip IC including a substrate and a circuit unit. The substrate has a first surface and a second surface which are opposite each other in the thickness direction of the substrate. The substrate is, for example, a silicon substrate. The circuit unit includes multiple FETs as multiple switching devices. Each of the switching devices is not limited to a FET, and, for example, may be a bipolar transistor. The first electronic component 3, which forms the first switch 17, is flip-chip mounted on the second principal surface 22 of the mount substrate 2 so that the first surface of the substrate is positioned on the second principal surface 22 side of the mount substrate 2. In plan view in the thickness direction D1 of the mount substrate 2, the outer edges of the first electronic component 3, which forms the first switch 17, have a rectangular shape.

(4.9) First IC Chip

The first IC chip 26 includes the third switch 19, the fourth switch 20, the first low-noise amplifier 141, and the second low-noise amplifier 142. The first IC chip 26 is flip-chip mounted on the second principal surface 22 of the mount substrate 2. In plan view in the thickness direction D1 of the mount substrate 2, the outer edges of the first IC chip 26 have a rectangular shape.

(4.10) Second IC Chip

The second IC chip 27 includes the second switch 18. The second IC chip 27 is flip-chip mounted on the second principal surface 22 of the mount substrate 2. In plan view in the thickness direction D1 of the mount substrate 2, the outer edges of the second IC chip 27 have a rectangular shape.

(4.11) Controller

The second electronic component 4, which forms the controller 23, is, for example, a single-chip IC including a substrate and a circuit unit. The substrate has a first surface and a second surface which are opposite each other. The substrate is, for example, a silicon substrate. The circuit unit includes a control circuit which controls the first power amplifier 111 and the second power amplifier 112 in accordance with the control signals from the signal processing circuit 92. The controller 23 is flip-chip mounted on the second principal surface 22 of the mount substrate 2, for example, so that the first surface of the substrate is positioned on the second principal surface 22 side of the mount substrate 2. In plan view in the thickness direction D1 of the mount substrate 2, the outer edges of the second electronic component 4, which forms the controller 23, have a rectangular shape.

(5) Communication Device

As illustrated in FIG. 1, the communication device 9 includes the radio frequency circuit 1, the antennas 911 and 912, and the signal processing circuit 92.

(5.1) Antenna

The antenna 911 is connected to the antenna terminal 101 of the radio frequency circuit 1. The antenna 912 is connected to the antenna terminal 102 of the radio frequency circuit 1. Each of the antennas 911 and 912 has a transmission function of radiating, as radio waves, transmit signals which are output from the radio frequency circuit 1, and a reception function of receiving, as radio waves, receive signals from the outside and outputting the received receive signals to the radio frequency circuit 1.

(5.2) Signal Processing Circuit

The signal processing circuit 92 includes the RF signal processing circuit 93 and a baseband signal processing circuit 94. The signal processing circuit 92 processes signals passing through the radio frequency circuit 1. More specifically, the signal processing circuit 92 processes transmit signals and receive signals.

The RF signal processing circuit 93 is, for example, an RFIC (Radio Frequency Integrated Circuit). The RF signal processing circuit 93 performs signal processing on radio frequency signals.

The RF signal processing circuit 93 performs signal processing such as upconverting on transmit signals which are output from the baseband signal processing circuit 94, and outputs the transmit signals, which have been subjected to the signal processing, to the radio frequency circuit 1. The RF signal processing circuit 93 performs signal processing such as down-converting on receive signals which are output from the radio frequency circuit 1, and outputs the receive signals, which have been subjected to the signal processing, to the baseband signal processing circuit 94.

The baseband signal processing circuit 94 is, for example, a BBIC (Baseband Integrated Circuit). The baseband signal processing circuit 94 performs predetermined signal processing on transmit signals from the outside of the signal processing circuit 92. For example, receive signals, which have been processed by the baseband signal processing circuit 94, are used as image signals for image display, or are used as audio signals for telephone calls.

The RF signal processing circuit 93 also has a function as a controller which controls connections of the first switch 17, the second switch 18, the third switch 19, and the fourth switch 20, which are included in the radio frequency circuit 1, on the basis of transmission/reception of radio frequency signals (transmit signals, receive signals). Specifically, the RF signal processing circuit 93 switches connections of the first switch 17, the second switch 18, the third switch 19, and the fourth switch 20 of the radio frequency circuit 1 through control signals (not illustrated). The controller may be disposed outside the RF signal processing circuit 93, and, for example, may be disposed in the radio frequency circuit 1 or the baseband signal processing circuit 94.

(6) Operations of the Phase Circuit

Operations of the phase circuit 25 will be described by referring to FIG. 5.

In the case of simultaneous transmission of the first transmit signal S1 in the first communication band and the second transmit signal S2 in the second communication band, as illustrated in FIG. 5, the common terminal 18A (first terminal) of the second switch 18 is connected to the selection terminal 182, and the common terminal 18B (second terminal) of the second switch 18 is connected to the selection terminal 180 (third terminal) and the selection terminal 185 (fifth terminal). That is, in the case of simultaneous transmission of the first transmit signal S1 and the second transmit signal S2, the selection terminal 180 is connected to the common terminal 18B. At that time, the first power amplifier 111 is connected to the transmit filter 122 (see FIG. 1), and the second power amplifier 112 is connected to the transmit filter 125 (see FIG. 1). The inductor 251 of the phase circuit 25 is shunt-connected to the signal path between the second power amplifier 112 and the transmit filter 125.

As described above, the transmit filter 122 has a passband including the transmit band of Band 8 (first communication band) according to the 3GPP LTE standard, and the transmit band of Band 8 is 880 MHz to 915 MHZ. As described above, the transmit filter 125 has a passband including the transmit band of Band 20 (second communication band) according to the 3GPP LTE standard, and the transmit band of Band 20 is 832 MHz to 862 MHz. Thus, the transmit band of Band 8 does not overlap the transmit band of Band 20 at all. Thus, the radio frequency circuit 1 according to the first embodiment is capable of performing two-uplink carrier aggregation using Band 8 and Band 20. That is, the first communication band and the second communication band are communication bands available for simultaneous transmission.

When the transmit filter 122 and the transmit filter 125 perform two-uplink carrier aggregation, the first power amplifier 111 receives the first transmit signal S1, and the second power amplifier 112 receives the second transmit signal S2 (see FIG. 5). In this case, inter-modulation distortion (IMD) occurs between the first transmit signal S1 and the second transmit signal S2. In particular, the third-order inter-modulation distortion (hereinafter also referred to as "IMD3") which occurs between the fundamental waves of one of the transmit signals and the second harmonic of the other transmit signal may affect the reception sensitivity.

For example, assume the case in which the frequency of the first transmit signal S1 is 897.5 MHz and the frequency of the second transmit signal S2 is 847 MHz. In this case, the frequency of the IMD3, which occurs on the first power amplifier 111 side, is 948 MHZ ($=2 \times 897.5$ MHZ-847 MHz).

As described above, the receive filter 132 has a passband including the receive band of Band 8 (first communication band) according to the 3GPP LTE standard, and the receive band of Band 8 is 925 MHz to 960 MHz. In this case, the frequency (948 MHz) of the IMD3, which occurs on the first power amplifier 111 side, is included in the receive band of Band 8. That is, at least a part of the frequency range of the inter-modulation distortion, which occurs between the first transmit signal S1 in the first communication band and the second transmit signal S2 in the second communication band, overlaps at least a part of the receive band of the first communication band. Therefore, the IMD3, which occurs on the first power amplifier 111 side, may reduce the reception sensitivity.

Similarly, assume the case in which the frequency of the first transmit signal S1 is 897.5 MHz and the frequency of the second transmit signal S2 is 847 MHz. In this case, the frequency of the IMD3, which occurs on the second power amplifier 112 side, is 796.5 MHZ (=2×847 MHZ-897.5 MHz). As described above, the receive filter 135 has a passband including the receive band of Band 20 (second communication band) according to the 3GPP LTE standard, and the receive band of Band 20 is 791 MHz to 821 MHz. In this case, the frequency (796.5 MHz) of the IMD3, which occurs on the second power amplifier 112 side, is included in the receive band of Band 20. Therefore, the IMD3, which occurs on the second power amplifier 112 side, may reduce the reception sensitivity.

As described above, in the radio frequency circuit 1 according to the first embodiment, the inductor 251 of the phase circuit 25 is shunt-connected to the signal path between the second power amplifier 112 and the transmit filter 125. Therefore, the phase of the second transmit signal S2, which is output from the second power amplifier 112, may be changed. This enables the input-side leakage signal of the second transmit signal S2 and the output-side leakage signal of the second transmit signal S2 to be cancelled each other, and enables the leakage signal of the second transmit signal S2 to be made small. Thus, the amplitude of the IMD3, which occurs between the first transmit signal S1 and the second transmit signal S2, may be made small. As a result, influence of the IMD3 on the receive filter 132 may be reduced. In short, the radio frequency circuit 1 according to the first embodiment enables reduction of the reception sensitivity, which is caused by the IMD3, to be suppressed.

As described above, the first power amplifier 111 supports the first power class, and the second power amplifier 112 supports the second power class. The maximum output power of the first power class is larger than that of the second power class. That is, the first power amplifier 111 needs larger maximum output power than the second power amplifier 112. Therefore, in the case of simultaneous transmission of the first transmit signal S1 and the second transmit signal S2, in the radio frequency circuit 1 according to the first embodiment, the phase circuit 25 is connected to the signal path on the second power amplifier 112 side whose maximum output power is smaller. This enables suppression of the signal loss (loss), which is caused by the phase circuit 25, in the signal path on the first power amplifier 111 side whose maximum output power is larger.

(7) The Layout of the Radio Frequency Circuit (7.1) The Layout of the Output Matching Circuits and the Phase Circuit The layout of the output matching circuits (the first output matching circuit 151 and the second output matching circuit 152) and the phase circuit 25 will be described by referring to FIG. 6.

As described above, in the radio frequency circuit 1 according to the first embodiment, each of the first output matching circuit 151 and the second output matching circuit 152 includes an inductor (second inductor) 150. As described above, in the radio frequency circuit 1, the phase circuit 25 includes the inductor (first inductor) 251. As illustrated in FIG. 6, an inductor 150 has a winding unit (second winding unit) 1501. As illustrated in FIG. 6, the inductor 251 has a winding unit (first winding unit) 2511.

The winding axis (first winding axis) Ax1 of the winding unit 2511 in the phase circuit 25 is parallel to the first principal surface 21 of the mount substrate 2, and extends in the second direction D2 orthogonal to the first direction D1 (see FIG. 4) which is the thickness direction of the mount substrate 2. The "winding axis Ax1" is the virtual central axis of the winding unit 2511.

In each of the first output matching circuit 151 and the second output matching circuit 152, the winding axis (second winding axis) Ax2 of the winding unit 1501 is parallel to the first principal surface 21 of the mount substrate 2 and extends in the third direction D3 orthogonal to both the first direction D1, which is the thickness direction of the mount substrate 2, and the second direction D2. The winding axis Ax2 of the winding unit 1501 in the first output matching circuit 151 is parallel to that in the second output matching circuit 152. The "winding axis Ax2" is the virtual central axis of the winding unit 1501.

That is, as illustrated in FIG. 6, the winding axis Ax1 of the winding unit 2511 in the phase circuit 25 is orthogonal to the winding axis Ax2 of the winding unit 1501 in each of the first output matching circuit 151 and the second output matching circuit 152. This enables suppression of influence of the magnetic flux of each of the output matching circuits 151 and 152 on the phase circuit 25 and influence of the magnetic flux of the phase circuit 25 on each of the output matching circuits 151 and 152.

(7.2) The Layout of the Phase Circuit and the Second Switch

The layout of the phase circuit 25 and the second switch 18 will be described by referring to FIGS. 2 to 4.

As illustrated in FIG. 2, the phase circuit 25 is disposed on the first principal surface 21 of the mount substrate 2. As illustrated in FIG. 3, the second switch 18 is disposed on the second principal surface 22 of the mount substrate 2. As illustrated in FIG. 4, in plan view in the thickness direction D1 of the mount substrate 2, the phase circuit 25 overlaps the second switch 18. More specifically, in plan view in the thickness direction D1 of the mount substrate 2, the inductor 251 of the phase circuit 25 overlaps the second switch 18. In the radio frequency circuit 1 according to the present embodiment, in plan view in the thickness direction D1 of the mount substrate 2, the entire inductor 251 overlies a part of the second switch 18. In contrast, for example, in plan view in the thickness direction D1 of the mount substrate 2, a part of the inductor 251 may overlie the entire second switch 18; a part of the inductor 251 may overlie a part of the second switch 18; the entire inductor 251 may overlie the entire second switch 18. In short, the expression, "In plan view in the thickness direction D1 of the mount substrate 2, the inductor 251 overlaps the second switch 18", refers to the state in which, in plan view in the thickness direction D1 of the mount substrate 2, at least a part of the inductor 251 overlies at least a part of the second switch 18.

In the radio frequency circuit 1 according to the first embodiment, as described above, in plan view in the thickness direction D1 of the mount substrate 2, the inductor 251 overlaps the second switch 18. This enables the wiring length between the inductor 251 and the second switch 18 to be made short.

(8) Effects

In the second switch 18 of the radio frequency circuit 1 according to the first embodiment, the common terminal 18A is connected to the first power amplifier 111; the common terminal 18B is connected to the second power amplifier 112; the selection terminal 182 is connected to the transmit filter 122; the selection terminal 185 is connected to the transmit filter 125; the selection terminal 180 is connected to the phase circuit 25. Therefore, for example, when the common terminal 18B is connected to the selection terminal 180, the phase of the second transmit signal S2, which is output from the second power amplifier 112, may be changed. Thus, the amplitude of the inter-modulation distortion, which occurs between the first transmit signal S1 and the second transmit signal S2, may be made small. As a result, reduction of the reception sensitivity, which is caused by the inter-modulation distortion, may be suppressed.

In the radio frequency circuit 1 according to the first embodiment, as described above, the winding axis (first winding axis) Ax1 of the winding unit (first winding unit) 2511 in the phase circuit 25 is orthogonal to the winding axis (second winding axis) Ax2 of the winding unit (second winding unit) 1501 in each of the first output matching circuit 151 and the second output matching circuit 152. This enables suppression of influence of the magnetic flux of each of the output matching circuits 151 and 152 on the phase circuit 25 and influence of the magnetic flux of the phase circuit 25 on each of the output matching circuits 151 and 152.

In the radio frequency circuit 1 according to the first embodiment, in plan view in the thickness direction D1 of the mount substrate 2, the inductor 251 of the phase circuit 25 overlaps the second switch 18. This enables the wiring length between the inductor 251 and the second switch 18 to be made short.

(9) Modified Examples

The radio frequency circuit 1 according to a first modified example of the first embodiment will be described by referring to FIG. 7. In the description about the radio frequency circuit 1 according to the first modified example, substantially the same configurations as those of the radio frequency circuit 1 according to the first embodiment are designated with the same reference numerals, and will not be described.

The radio frequency circuit 1 according to the first modified example is different from the radio frequency circuit 1 (see FIG. 6) according to the first embodiment in that the winding axis Ax2 of the winding unit 1501 in each of the first output matching circuit 151 and the second output matching circuit 152 extends in the thickness direction D1 (see FIG. 4) of the mount substrate 2.

Figure 7:
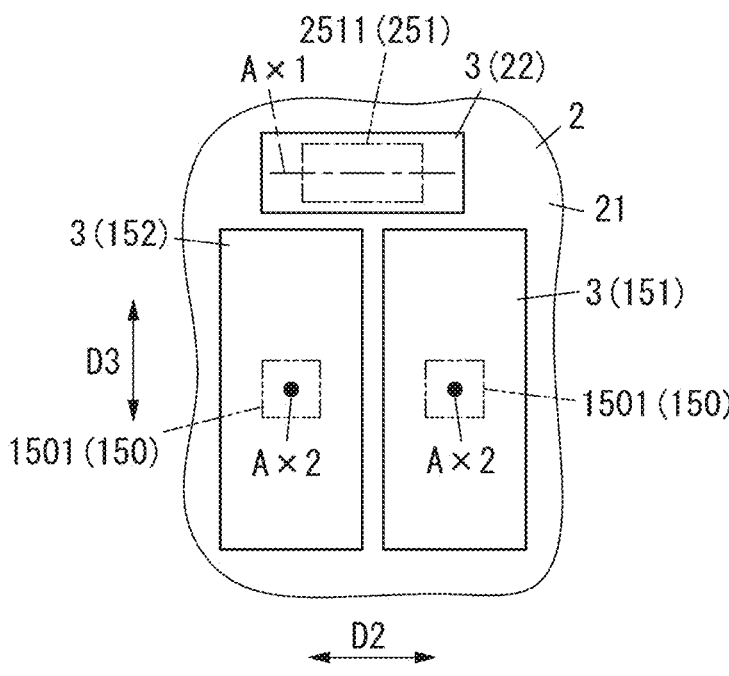
FIG. 7 is a plan view of a principal part of a radio frequency circuit according to a first modified example of the first embodiment.

In the radio frequency circuit 1 according to the first modified example, as illustrated in FIG. 7, the first electronic component 3, which forms the phase circuit 25, and the first electronic components 3, which form the first output matching circuit 151 and the second output matching circuit 152 respectively, are disposed on the first principal surface 21 of the mount substrate 2.

In the radio frequency circuit 1 according to the first modified example, like the radio frequency circuit 1 according to the first embodiment, each of the first output matching circuit 151 and the second output matching circuit 152 includes an inductor (second inductor) 150, and the phase circuit 25 includes the inductor (first inductor) 251. As illustrated in FIG. 7, an inductor 150 has a winding unit (second winding unit) 1501. As illustrated in FIG. 7, the inductor 251 has the winding unit (first winding unit) 2511.

The winding axis (first winding axis) Ax1 of the winding unit 2511 in the phase circuit 25 is parallel to the first principal surface 21 of the mount substrate 2, and extends in the second direction D2 orthogonal to the first direction D1 which is the thickness direction of the mount substrate 2.

In each of the first output matching circuit 151 and the second output matching circuit 152, the winding axis (second winding axis) Ax2 of the winding unit 1501 is orthogonal to the first principal surface 21 of the mount substrate 2. That is, the winding axis Ax2 of the winding unit 1501 extends in the thickness direction D1 of the mount substrate 2. The winding axis Ax2 of the winding unit 1501 in the first output matching circuit 151 is parallel to that in the second output matching circuit 152.

That is, as illustrated FIG. 7, the winding axis Ax1 of the winding unit 2511 in the phase circuit 25 is orthogonal to the winding axis Ax2 of the winding unit 1501 in each of the first output matching circuit 151 and the second output matching circuit 152. Like the radio frequency circuit 1 according to the first embodiment, this enables suppression of influence of the magnetic flux of each of the output matching circuits 151 and 152 on the phase circuit 25 and influence of the magnetic flux of the phase circuit 25 on each of the output matching circuits 151 and 152.

Second Embodiment

The radio frequency circuit 1 according to the second embodiment will be described by referring to FIG. 8. In the description of the radio frequency circuit 1 according to the second embodiment, substantially the same configurations as those of the radio frequency circuit 1 according to the first embodiment are designated with the same reference numerals, and will not be described.

Figure 8:
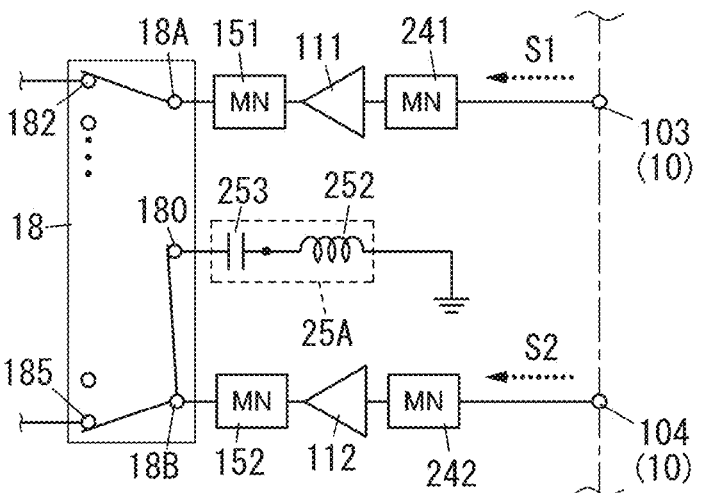
FIG. 8 is a diagram illustrating the circuit configuration of a principal part of a radio frequency circuit according to a second embodiment.

As illustrated in FIG. 8, the radio frequency circuit 1 according to the second embodiment is different from the radio frequency circuit 1 (see FIG. 5) according to the first embodiment in that a phase circuit 25A includes an inductor 252 and a capacitor 253.

In the radio frequency circuit 1 according to the second embodiment, as illustrated in FIG. 8, the phase circuit (circuit) 25A includes the inductor 252 and the capacitor 253. The capacitor 253 is connected, at its first end, to the selection terminal 180 of the second switch 18, and is connected, at its second end, to a first end of the inductor 252. The inductor 252 is connected, at its second end, to the ground. That is, in the radio frequency circuit 1 according to the second embodiment, the inductor 252 and the capacitor 253 are connected in series between the selection terminal 180 (third terminal) and the ground. In the radio frequency circuit 1 according to the second embodiment, as illustrated in FIG. 8, in the case of simultaneous transmission of the first transmit signal S1 and the second transmit signal S2, the selection terminal 180 is connected to the common terminal (second terminal) 18B.

Like the radio frequency circuit 1 according to the first embodiment, in the second switch 18 of the radio frequency circuit 1 according to the second embodiment, the common terminal 18A is connected to the first power amplifier 111; the common terminal 18B is connected to the second power amplifier 112; the selection terminal 180 is connected to the phase circuit 25A. Therefore, for example, when the common terminal 18B is connected to the selection terminal 180, the phase of the second transmit signal S2, which is output from the second power amplifier 112, may be changed. This enables the amplitude of the inter-modulation distortion, which occurs between the first transmit signal S1 and the second transmit signal S2, to be made small. As a result, reduction of the reception sensitivity, which is caused by the inter-modulation distortion, may be suppressed.

In the radio frequency circuit 1 according to the second embodiment, the selection terminal (third terminal) 180 is connected to the common terminal (second terminal) 18B, and the phase circuit 25A changes the phase of the second transmit signal S2. In contrast, for example, the selection terminal 180 may be connected to the common terminal (first terminal) 18A, and the phase circuit 25A may change the phase of the first transmit signal S1. Also in this case, reduction of the reception sensitivity, which is caused by the inter-modulation distortion, may be suppressed.

The capacitor 253 included in the phase circuit 25A may be included in the second IC chip 27 (see FIG. 3) which also includes the second switch 18 described above. That is, the capacitor 253, which is at least a part of the phase circuit 25A, and the second switch 18 may form a single chip. Compared with the case in which the capacitor 253 of the phase circuit 25A and the second switch 18 are disposed separately, this enables the footprint of the mount substrate 2 to be made small.

Third Embodiment

The radio frequency circuit 1 according to the third embodiment will be described by referring to FIG. 9. In the description about the radio frequency circuit 1 according to the third embodiment, substantially the same configurations as those of the radio frequency circuit 1 according to the first embodiment are designated with the same reference numerals, and will not be described.

Figure 9:
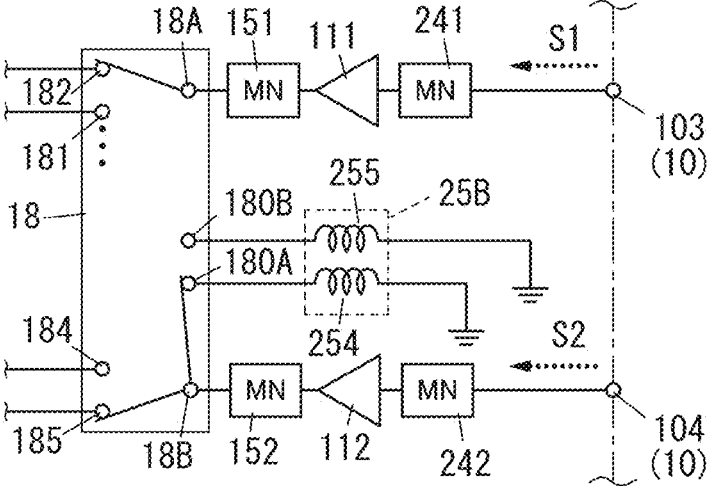
FIG. 9 is a diagram illustrating the circuit configuration of a principal part of a radio frequency circuit according to a third embodiment.

As illustrated in FIG. 9, the radio frequency circuit 1 according to the third embodiment is different from the radio frequency circuit 1 (see FIG. 5) according to the first embodiment in that a phase circuit 25B includes two inductors 254 and 255. As illustrated in FIG. 9, the radio frequency circuit 1 according to the third embodiment is different from the radio frequency circuit 1 according to the first embodiment in that the second switch 18 further includes a selection terminal (sixth terminal) 180B as well as the common terminal (first terminal) 18A, the common terminal (second terminal) 18B, a selection terminal (third terminal) 180A, the selection terminal 182 (fourth terminal), and the selection terminal 185 (fifth terminal).

In the radio frequency circuit 1 according to the third embodiment, as illustrated in FIG. 9, the phase circuit (circuit) 25B includes the two inductors 254 and 255. The inductor 254 is connected between the selection terminal 180A of the second switch 18 and the ground. The inductor 255 is connected between the selection terminal 180B of the second switch 18 and the ground. That is, in the radio frequency circuit 1 according to the third embodiment, the second switch 18 further has the selection terminal (sixth terminal) 180B as well as the common terminal (first terminal) 18A, the common terminal (second terminal) 18B, a selection terminal (third terminal) 180A, the selection terminal 182 (fourth terminal), and the selection terminal 185 (fifth terminal). In the radio frequency circuit 1 according to the third embodiment, the inductor 254 is a first inductor, and the inductor 255 is a second inductor.

In the radio frequency circuit 1 according to the third embodiment, for example, in the case of two-uplink carrier aggregation using the transmit filter 122 (see FIG. 1) and the transmit filter 125 (see FIG. 1), the common terminal 18A is connected to the selection terminal 182; the common terminal 18B is connected to the selection terminal 180A and the selection terminal 185. In this case, the inductor 254 of the phase circuit 25B is capable of changing the phase of the second transmit signal S2 which is output from the second power amplifier 112. In this case, Band 8 according to the 3GPP LTE standard is the first communication band; Band 20 according to the 3GPP LTE standard is the second communication band. That is, when the combination of the first communication band and the second communication band is a first combination, the common terminal 18B is connected to the selection terminal 180A.

In the radio frequency circuit 1 according to the third embodiment, for example, in the case of two-uplink carrier aggregation using the transmit filter 121 (see FIG. 1) and the transmit filter 124 (see FIG. 1), the common terminal 18A is connected to the selection terminal 181; the common terminal 18B is connected to the selection terminal 180B and the selection terminal 184. In this case, the inductor 255 of the phase circuit 25B is capable of changing the phase of the second transmit signal S2 which is output from the second power amplifier 112. In this case, Band 5 according to the 3GPP LTE standard is the first communication band; Band 13 according to the 3GPP LTE standard is the second communication band. That is, when the combination of the first communication band and the second communication band is a second combination, the common terminal 18B is connected to the selection terminal 180B.

Like the radio frequency circuit 1 according to the first embodiment, in the second switch 18 in the radio frequency circuit 1 according to the third embodiment, the common terminal 18A is connected to the first power amplifier 111; the common terminal 18B is connected to the second power amplifier 112; the selection terminals 180A and 180B are connected to the phase circuit 25B. Therefore, for example, when the common terminal 18B is connected to the selection terminal 180A or the selection terminal 180B, the phase of the second transmit signal S2, which is output from the second power amplifier 112, may be changed. This enables the amplitude of the inter-modulation distortion, which occurs between the first transmit signal S1 and the second transmit signal S2, to be made small. As a result, reduction of the reception sensitivity, which is caused by the inter-modulation distortion, may be suppressed.

In the radio frequency circuit 1 according to the third embodiment, the selection terminal (third terminal) 180A or the selection terminal (fourth terminal) 180B is connected to the common terminal (second terminal) 18B, and the phase circuit 25B changes the phase of the second transmit signal S2. In contrast, for example, the selection terminal 180A or the selection terminal 180B may be connected to the common terminal (first terminal) 18A, and the phase circuit 25B may change the phase of the first transmit signal S1. Also in this case, reduction of the reception sensitivity, which is caused by the inter-modulation distortion, may be suppressed.

In the radio frequency circuit 1 according to the third embodiment, for example, Band 1 according to the 3GPP LTE standard may be the first communication band, and Band 3 according to the 3GPP LTE standard may be the second communication band.

Fourth Embodiment

The radio frequency circuit 1 according to the fourth embodiment will be described by referring to FIG. 10. In the description about the radio frequency circuit 1 according to the fourth embodiment, substantially the same configurations as those of the radio frequency circuit 1 according to the first embodiment are designated with the same reference numerals, and will not be described.

The radio frequency circuit 1 according to the fourth embodiment is different from the radio frequency circuit 1 (see FIG. 5) according to the first embodiment in that a capacitor 257, which is a part of a phase circuit 25C, is connected in series between the second power amplifier 112 and the transmit filters 121 to 129 (see FIG. 1).

Figure 10:
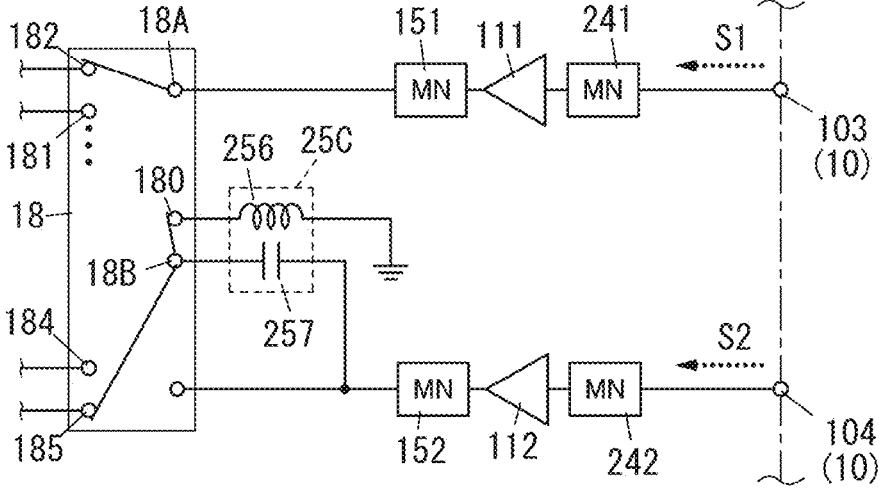
FIG. 10 is a diagram illustrating the circuit configuration of a principal part of a radio frequency circuit according to a fourth embodiment.

In the radio frequency circuit 1 according to the fourth embodiment, as illustrated in FIG. 10, the phase circuit (circuit) 25C includes an inductor 256 and the capacitor 257. The inductor 256 is connected between the selection terminal (third terminal) 180 of the second switch 18 and the ground. The capacitor 257 is connected between the common terminal (second terminal) 18B of the second switch 18 and the second output matching circuit (output matching circuit) 152.

In the radio frequency circuit 1 according to the fourth embodiment, for example, in the case of two-uplink carrier aggregation using the transmit filter 122 (see FIG. 1) and the transmit filter 125 (see FIG. 1), the common terminal 18A is connected to the selection terminal 182, and the common terminal 18B is connected to the selection terminal 180 and the selection terminal 185. That is, in the case of simultaneous transmission using the first transmit signal S1 and the second transmit signal S2, the common terminal 18B is connected to the selection terminal 180. In this case, the capacitor 257 is connected in series between the second output matching circuit 152 and the transmit filter 125. The inductor 256 is shunt-connected to the signal path connecting the second output matching circuit 152 to the transmit filter 125. In the radio frequency circuit 1 according to the fourth embodiment, Band 8 according to the 3GPP LTE standard is the first communication band; Band 20 according to the 3GPP LTE standard is the second communication band.

Like the radio frequency circuit 1 according to the first embodiment, in the second switch 18 in the radio frequency circuit 1 according to the fourth embodiment, the common terminal 18A is connected to the first power amplifier 111; the common terminal 18B is connected to the second power amplifier 112; the selection terminal 180 is connected to the phase circuit 25C. Therefore, for example, when the common terminal 18B is connected to the selection terminal 180, the phase of the second transmit signal S2, which is output from the second power amplifier 112, may be changed. This enables the amplitude of the inter-modulation distortion, which occurs between the first transmit signal S1 and the second transmit signal S2, to be made small. As a result, reduction of the reception sensitivity, which is caused by the inter-modulation distortion, may be suppressed.

In the radio frequency circuit 1 according to the fourth embodiment, the selection terminal (third terminal) 180 is connected to the common terminal (second terminal) 18B, and the phase circuit 25C changes the phase of the second transmit signal S2. In contrast, for example, the selection terminal 180 may be connected to the common terminal (first terminal) 18A, and the phase circuit 25C may change the phase of the first transmit signal S1. Also in this case, reduction of the reception sensitivity, which is caused by the inter-modulation distortion, may be suppressed.

Fifth Embodiment

The radio frequency circuit 1 according to the fifth embodiment will be described by referring to FIG. 11. In the description about the radio frequency circuit 1 according to the fifth embodiment, substantially the same configurations as those of the radio frequency circuit 1 according to the first embodiment are designated with the same reference numerals, and will not be described.

The radio frequency circuit 1 according to the fifth embodiment is different from the radio frequency circuit 1 (see FIG. 5) according to the first embodiment in that a phase circuit 25D is connected to a selection terminal 194 (second terminal) of the third switch 19 connected to the first low-noise amplifier 141.

Figure 11:
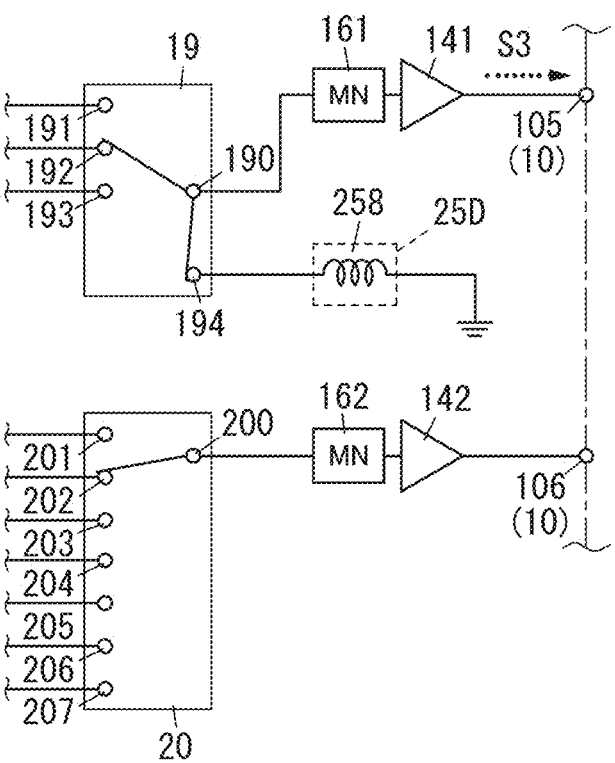
FIG. 11 is a diagram illustrating the circuit configuration of a principal part of a radio frequency circuit according to a fifth embodiment.

As illustrated in FIG. 11, in the radio frequency circuit 1 according to the fifth embodiment, the phase circuit (circuit) 25D is connected to the selection terminal 194 (second terminal) of the third switch 19. The phase circuit 25D includes an inductor 258. In the radio frequency circuit 1 according to the fifth embodiment, for example, in the case of two-uplink carrier aggregation using the transmit filter 122 (see FIG. 1) and the transmit filter 125 (see FIG. 1), the common terminal 190 (first terminal) of the third switch 19 is connected to the selection terminal 192 (third terminal) and the selection terminal 194. Thus, the inductor 258 of the phase circuit 25D is shunt-connected to the signal path between the first low-noise amplifier 141 and the receive filter 132.

In the radio frequency circuit 1 according to the fifth embodiment, the phase circuit 25D is capable of changing the phase of a receive signal S3 received by the first low-noise amplifier 141. As a result, a receive filter (for example, the receive filter 132) is difficult to receive influence of the IMD3, enabling suppression of reduction of the reception sensitivity.

In the radio frequency circuit 1 according to the fifth embodiment, unlike the first to fourth embodiments, the phase circuit 25D is disposed on the reception path side, enabling suppression of signal loss (loss) of the first transmit signal S1 and the second transmit signal S2.

In the radio frequency circuit 1 according to the fifth embodiment, the phase circuit 22D includes the inductor 258. Alternatively, the phase circuit 22D may include a capacitor, or may include an inductor and a capacitor.

MODIFIED EXAMPLES

Modified examples of the first to fifth embodiments will be described below.

Each of the transmit filters 121 to 129 and the receive filters 131 to 139 according to the first to fifth embodiments is not limited to a surface acoustic wave filter, and may be, for example, a BAW (Bulk Acoustic Wave) filter. The resonator in the BAW filter is, for example, a FBAR (Film Bulk Acoustic Resonator) or a SMR (Solidly Mounted Resonator). The BAW filter has a substrate. The substrate is, for example, a silicon substrate.

Each of the transmit filters 121 to 129 and the receive filters 131 to 139 according to the first to fifth embodiments is not limited to a ladder filter, and may be, for example, a longitudinally coupled resonator-type surface acoustic wave filter.

The acoustic-wave filter described above is an acoustic-wave filter using surface acoustic waves or bulk acoustic waves. However, the acoustic-wave filter is not limited to this, and may be, for example, an acoustic-wave filter using boundary acoustic waves, plate waves, or the like.

The combination of the first communication band and the second communication band is not limited to the combination described above. For example, the first communication band may be Band 25 according to the 3GPP LTE standard, and the second communication band may be Band 66 according to the 3GPP LTE standard. Alternatively, the first communication band may be Band 1 according to the 3GPP LTE standard, and the second communication band may be Band 3 according to the 3GPP LTE standard.

The circuit connected to the selection terminals 180, 180A, and 180B of the second switch 18 is not limited to any of the phase circuits 25 and 25A to 25C, and may be a circuit other than a phase circuit. The circuit connected to the selection terminal 194 of the third switch 19 is not limited to the phase circuit 25D, and may be a circuit other than a phase circuit.

In the present specification, an expression, "A component is disposed on a first principal surface of a substrate", encompasses, not only the case in which the component is mounted directly on the first principal surface of the substrate, but also the case in which the component is disposed in the first-principal-surface-side space from among the first-principal-surface-side space and the second-principal-surface-side space which are separated by the substrate. That is, the expression, "A component is disposed on a first principal surface of a substrate", encompasses the case in which the component is mounted on the first principal surface of the substrate, for example, with a different circuit device or electrode interposed in between. The component is, for example, a first electronic component 3, but is not limited to a first electronic component 3. The substrate is, for example, the mount substrate 2. When the substrate is the mount substrate 2, the first principal surface is the first principal surface 21, and the second principal surface is the second principal surface 22.

In the present specification, an expression, "A component is disposed on a second principal surface of a substrate", encompasses, not only the case in which the component is mounted directly on the second principal surface of the substrate, but also the case in which the component is disposed in the second-principal-surface-side space from among the first-principal-surface-side space and the second-principal-surface-side space which are separated by the substrate. That is, the expression, "A component is disposed on a second principal surface of a substrate", encompasses the case in which the component is mounted on the second principal surface of the substrate, for example, with a different circuit device or electrode interposed in between. The component is, for example, a second electronic component 4, but is not limited to a second electronic component 4. The substrate is, for example, the mount substrate 2. When the substrate is the mount substrate 2, the first principal surface is the first principal surface 21, and the second principal surface is the second principal surface 22.

In the present specification, an expression, "A is orthogonal to B", encompasses, not only the state in which the angle of A to B is strictly 90°, but also the case in which the angle of A to B is in the intersection range (for example, +5 degrees) in which the effects are substantially obtained. In the present specification, an expression, "A is parallel to B", encompasses, not only the state in which the angle of A to B is strictly 0 degree, but also the case in which the angle of A to B is in the intersection range (for example, +5 degrees) in which the effects are substantially obtained.

In the present specification, an expression, "A and B form a single chip", refers to the state in which a circuit, which forms A, and a circuit, which forms B, are formed on the common (single) substrate. A is, for example, the capacitor 253, but is not limited to the capacitor 253. B is, for example, the second switch 18, but is not limited to the second switch 18.

In the present specification, an expression, "A and B are connectable to C simultaneously", refers to the case in which A and B may be connected to C simultaneously. A is, for example, the selection terminal 184 of the second switch 18, but is not limited to the selection terminal 184. B is, for example, the selection terminal 180 of the second switch 18, but is not limited to the selection terminal 180. C is, for example, the common terminal 18B, but is not limited to the common terminal 18B.

Aspects

In the present specification, the aspects described below are disclosed.

A radio frequency circuit (1) according to a first aspect includes a first filter (122), a second filter (125), a third filter (132), a first power amplifier (111), a second power amplifier (112), and a switch (18). The first filter (122) has a passband including the transmit band of a first communication band. The second filter (125) has a passband including the transmit band of a second communication band which is different from the first communication band. The third filter (132) has a passband including the receive band of the first communication band. The first power amplifier (111) is connected to the first filter (122). The second power amplifier (112) is connected to the second filter (125). The switch (18) has a first terminal (18A), a second terminal (18B), a third terminal (180; 180A), a fourth terminal (182), and a fifth terminal (185). The first communication band and the second communication band are communication bands available for simultaneous transmission. At least a part of the frequency range of inter-modulation distortion, which occurs between a first transmit signal (S1) in the first communication band and a second transmit signal (S2) in the second communication band, overlaps at least a part of the receive band of the first communication band. In the radio frequency circuit (1), the first terminal (18A) is connected to the first power amplifier (111); the second terminal (18B) is connected to the second power amplifier (112); the fourth terminal (182) is connected to the first filter (122); the fifth terminal (185) is connected to the second filter (125). The radio frequency circuit (1) further includes a circuit (25; 25A; 25B; 25C). The circuit (25; 25A; 25B; 25C) is connected to the third terminal (180; 180A). The circuit (25; 25A; 25B; 25C) includes either one or both of an inductor (251; 252; 254, 255; 256) and a capacitor (253; 257).

This aspect enables suppression of reduction of the reception sensitivity. The reduction is caused by the inter-modulation distortion which occurs between the first transmit signal and the second transmit signal.

A radio frequency circuit (1) according to a second aspect is such that, in the first aspect, when the first transmit signal (S1) and the second transmit signal (S2) are transmitted simultaneously, the third terminal (180; 180A) is connected to the first terminal (18A) or the second terminal (18B).

This aspect enables reduction of the reception sensitivity, which is caused by the inter-modulation distortion, to be suppressed.

A radio frequency circuit (1) according to a third aspect is such that, in the first aspect, the first power amplifier (111) supports a first power class, and the second power amplifier (112) supports a second power class. The maximum output power of the first power class is larger than that of the second power class. When the first transmit signal (S1) and the second transmit signal (S2) are transmitted simultaneously, the third terminal (180; 180A) is connected to the second terminal (18B).

This aspect enables suppression of signal loss of the first transmit signal (S1) which passes through the first power amplifier (111) supporting the first power class.

A radio frequency circuit (1) according to a fourth aspect is such that, in any one of the first to third aspects, at least a part (for example, the capacitor 253, 257) of the circuit (25A; 25C) and the switch (18) form a single chip.

This aspect enables the footprint of the mount substrate (2) to be made small compared with the case in which the at least a part of the circuit (25A; 25C) and the switch (18) are disposed separately.

A radio frequency circuit (1) according to a fifth aspect is such that, in the fourth aspect, the at least a part of the circuit (25A; 25C) includes the capacitor (253; 257).

This aspect enables the footprint of the mount substrate (2) to be made small compared with the case in which the capacitor (253; 257) and the switch (18) are disposed separately.

In any one of the first to fifth aspects, a radio frequency circuit (1) according to a sixth aspect further includes a first output matching circuit (151) and a second output matching circuit (152). The first output matching circuit (151) is connected between the first power amplifier (111) and the first terminal (18A). The second output matching circuit (152) is connected between the second power amplifier (112) and the second terminal (18B). The circuit (25) includes, as the inductor (251), a first inductor (251) having a first winding unit (2511). Each of the first output matching circuit (151) and the second output matching circuit (152) includes a second inductor (150) having a second winding unit (1501). The first winding unit (2511) has a winding axis (Ax1) orthogonal to the winding axis (Ax2) of the second winding unit (1501).

This aspect enables suppression of influence of the magnetic fluxes of the first output matching circuit (151) and the second output matching circuit (152) on the circuit (25) and influence of the magnetic flux of the circuit (25) on the first output matching circuit (151) and the second output matching circuit (152).

In any one of the first to sixth aspects, a radio frequency circuit (1) according to a seventh aspect further includes a mount substrate (2). The mount substrate (2) has a first principal surface (21) and a second principal surface (22) which are opposite each other. The circuit (25) includes the inductor (251). The inductor (251) is disposed on the first principal surface (21) of the mount substrate (2). The switch (18) is disposed on the second principal surface (22) of the mount substrate (2). In plan view in the thickness direction (D1) of the mount substrate (2), the inductor (251) overlaps the switch (18).

This aspect enables the wiring length between the inductor (251) and the switch (18) to be made short.

A radio frequency circuit (1) according to an eighth aspect is such that, in any one of the first to seventh aspects, the circuit (25A) includes the inductor (252) and the capacitor (253). The inductor (252) and the capacitor (253) are connected in series to each other between the third terminal (180) and the ground. When the first transmit signal (S1) and the second transmit signal (S2) are transmitted simultaneously, the third terminal (180) is connected to the first terminal (18A) or the second terminal (18B).

This aspect enables reduction of the reception sensitivity, which is caused by the inter-modulation distortion, to be suppressed.

A radio frequency circuit (1) according to a ninth aspect is such that, in any one of the first to seventh aspects, the switch (18) further has a sixth terminal (180B). The circuit (25B) includes, as the inductor, a first inductor (254) and a second inductor (255). The first inductor (254) is connected between the third terminal (180A) and the ground. The second inductor (255) is connected between the sixth terminal (180B) and the ground. When a combination of the first communication band and the second communication band is a first combination, the first terminal (18A) or the second terminal (18B) is connected to the third terminal (180A). When the combination of the first communication band and the second communication band is a second combination, the first terminal (18A) or the second terminal (18B) is connected to the fourth terminal (180B).

This aspect enables reduction of the reception sensitivity, which is caused by the inter-modulation distortion, to be suppressed in accordance with the combination of the first communication band and the second communication band.

In any one of the first to seventh aspects, a radio frequency circuit (1) according to a tenth aspect further includes an output matching circuit (152). The output matching circuit (152) is connected between the second power amplifier (112) and the switch (18). The circuit (25C) includes the inductor (256) and the capacitor (257). The inductor (256) is connected between the third terminal (180) and the ground. The capacitor (257) is connected between the first terminal (18A) or the second terminal (18B) and the output matching circuit (152). When the first transmit signal (S1) and the second transmit signal (S2) are transmitted simultaneously, the first terminal (18A) or the second terminal (18B) is connected to the third terminal (180).

This aspect enables reduction of the reception sensitivity, which is caused by the inter-modulation distortion, to be suppressed.

A radio frequency circuit (1) according to an eleventh aspect includes a first filter (122), a second filter (125), a third filter (132), a low-noise amplifier (141), and a switch (19). The first filter (122) has a passband including the transmit band of a first communication band. The second filter (125) has a passband including the transmit band of a second communication band which is different from the first communication band. The third filter (132) has a passband including the receive band of the first communication band. The low-noise amplifier (141) is connected to the third filter (132). The switch (19) has a first terminal (190), a second terminal (194), and a third terminal (192). The first communication band and the second communication band are communication bands available for simultaneous transmission. At least a part of the frequency range of inter-modulation distortion, which occurs between a first transmit signal (S1) in the first communication band and a second transmit signal (S2) in the second communication band, overlaps at least a part of the receive band of the first communication band. In the radio frequency circuit (1), the first terminal (190) is connected to the low-noise amplifier (141); the third terminal (192) is connected to the third filter (132). The radio frequency circuit (1) further includes a circuit (25D). The circuit (25D) is connected to the second terminal (194). The circuit (25D) includes either one or both of an inductor (258) and a capacitor.

This aspect enables suppression of reduction of the reception sensitivity. The reduction is caused by the inter-modulation distortion which occurs between the first transmit signal and the second transmit signal.

A communication device (9) according to a twelfth aspect includes the radio frequency circuit (1) according to any one of the first to eleventh aspects, and a signal processing circuit (92). The signal processing circuit (92) is connected to the radio frequency circuit (1).

This aspect enables reduction of the reception sensitivity, which is caused by the inter-modulation distortion, to be suppressed.

REFERENCE SIGNS LIST

1 radio frequency circuit
17 first switch
17A, 17B common terminal
171 to 179 selection terminal
18 second switch (switch)
18A common terminal (first terminal)
18B common terminal (second terminal)
180, 180A selection terminal (third terminal)
180B selection terminal (fourth terminal)
181 to 189 selection terminal
19 third switch (switch)
190 common terminal (first terminal)
191 to 193 selection terminal
194 selection terminal (second terminal)
20 fourth switch
200 common terminal
201 to 207 selection terminal
23 controller
25, 25A, 25B, 25C, 25D phase circuit (circuit)
251, 252, 254, 255, 256, 258 inductor
253, 257 capacitor
2511 winding unit (first winding unit)
26 first IC chip
27 second IC chip
31 to 39 duplexer
111 first power amplifier
112 second power amplifier
121 to 129 transmit filter
131 to 139 receive filter
141 first low-noise amplifier (low-noise amplifier)
142 second low-noise amplifier
151 first output matching circuit
152 second output matching circuit (output matching circuit)
1501 winding unit (second winding unit)
161, 162 input matching circuit
231 to 239 matching circuit
241, 242 input matching circuit
2 mount substrate
21 first principal surface
22 second principal surface
3 first electronic component
4 second electronic component
5 first resin layer

6 second resin layer
7 metal layer
9 communication device
92 signal processing circuit
93 RF signal processing circuit
94 baseband signal processing circuit
911, 912 antenna
10 external connection terminal
101, 102 antenna terminal
103, 104 signal input terminal
105, 106 signal output terminal
107 control terminal
Ax1 winding axis (first winding axis)
Ax2 winding axis (second winding axis)
D1 first direction (thickness direction)
D2 second direction
D3 third direction
S1 first transmit signal
S2 second transmit signal
S3 receive signal

The invention claimed is:

1. A radio frequency circuit comprising:

a first filter that has a passband including a transmit band of a first communication band;

a second filter that has a passband including a transmit band of a second communication band which is different from the first communication band;

a third filter that has a passband including a receive band of the first communication band;

a first power amplifier that is connected to the first filter;

a second power amplifier that is connected to the second filter; and a switch that has a first terminal, a second terminal, a third terminal, a fourth terminal, and a fifth terminal, wherein the first communication band and the second communication band are communication bands available for simultaneous transmission, wherein at least a part of a frequency range of inter-modulation distortion overlaps at least a part of the receive band of the first communication band, the inter-modulation distortion occurring between a first transmit signal in the first communication band and a second transmit signal in the second communication band, wherein the first terminal is connected to the first power amplifier, the second terminal is connected to the second power amplifier, the fourth terminal is connected to the first filter, the fifth terminal is connected to the second filter, wherein the radio frequency circuit further includes a circuit connected to the third terminal, and wherein the circuit includes at least one of an inductor and a capacitor.

2. The radio frequency circuit according to claim 1, wherein, when the first transmit signal and the second transmit signal are transmitted simultaneously, the third terminal is connected to the first terminal or the second terminal.

3. The radio frequency circuit according to claim 2, wherein at least a part of the circuit and the switch form a single chip.

4. The radio frequency circuit according to claim 3, wherein the at least a part of the circuit includes the capacitor.

5. The radio frequency circuit according to claim 4, further comprising:

a first output matching circuit that is connected between the first power amplifier and the first terminal; and a second output matching circuit that is connected between the second power amplifier and the second terminal, wherein the circuit includes, as the inductor, a first inductor having a first winding unit, wherein each of the first output matching circuit and the second output matching circuit includes a second inductor having a second winding unit, and wherein the first winding unit has a winding axis orthogonal to a winding axis of the second winding unit.

6. The radio frequency circuit according to claim 5, further comprising:

a mount substrate having a first principal surface and a second principal surface which are opposite each other, wherein the circuit includes the inductor, wherein the inductor is disposed on the first principal surface of the mount substrate, wherein the switch is disposed on the second principal surface of the mount substrate, and wherein, in plan view in a thickness direction of the mount substrate, the inductor overlaps the switch.

7. The radio frequency circuit according to claim 6, wherein the circuit includes the inductor and the capacitor, wherein the inductor and the capacitor are connected in series to each other between the third terminal and a ground, and wherein, when the first transmit signal and the second transmit signal are transmitted simultaneously, the third terminal is connected to the first terminal or the second terminal.

8. A communication device comprising:

The radio frequency circuit according to claim 1; and a signal processing circuit that is connected to the radio frequency circuit.

9. A communication device comprising:

the radio frequency circuit according to claim 2; and a signal processing circuit that is connected to the radio frequency circuit.

10. The radio frequency circuit according to claim 1, wherein the first power amplifier supports a first power class, wherein the second power amplifier supports a second power class, wherein the first power class has a maximum output power larger than a maximum output power of the second power class, and wherein, when the first transmit signal and the second transmit signal are transmitted simultaneously, the third terminal is connected to the second terminal.

11. A communication device comprising:

the radio frequency circuit according to claim 10; and a signal processing circuit that is connected to the radio frequency circuit.

12. The radio frequency circuit according to claim 10, wherein at least a part of the circuit and the switch form a single chip.

13. The radio frequency circuit according to claim 12, wherein the at least a part of the circuit includes the capacitor.

14. The radio frequency circuit according to claim 13, further comprising:

a first output matching circuit that is connected between the first power amplifier and the first terminal; and a second output matching circuit that is connected between the second power amplifier and the second terminal, wherein the circuit includes, as the inductor, a first inductor having a first winding unit, wherein each of the first output matching circuit and the second output matching circuit includes a second inductor having a second winding unit, and wherein the first winding unit has a winding axis orthogonal to a winding axis of the second winding unit.

15. The radio frequency circuit according to claim 14, further comprising:

a mount substrate having a first principal surface and a second principal surface which are opposite each other, wherein the circuit includes the inductor, wherein the inductor is disposed on the first principal surface of the mount substrate, wherein the switch is disposed on the second principal surface of the mount substrate, and wherein, in plan view in a thickness direction of the mount substrate, the inductor overlaps the switch.

16. The radio frequency circuit according to claim 15, wherein the circuit includes the inductor and the capacitor, wherein the inductor and the capacitor are connected in series to each other between the third terminal and a ground, and wherein, when the first transmit signal and the second transmit signal are transmitted simultaneously, the third terminal is connected to the first terminal or the second terminal.

17. A communication device comprising:

the radio frequency circuit according to claim 16; and a signal processing circuit that is connected to the radio frequency circuit.

18. The radio frequency circuit according to claim 15, wherein the switch further has a sixth terminal, wherein the circuit includes, as the inductor, a first inductor and a second inductor, wherein the first inductor is connected between the third terminal and a ground, wherein the second inductor is connected between the sixth terminal and a ground, wherein, when a combination of the first communication band and the second communication band is a first combination, the first terminal or the second terminal is connected to the third terminal, and wherein, when the combination of the first communication band and the second communication band is a second combination, the first terminal or the second terminal is connected to the fourth terminal.

19. The radio frequency circuit according to claim 15, further comprising:

an output matching circuit that is connected between the second power amplifier and the switch, wherein the circuit includes the inductor and the capacitor, wherein the inductor is connected between the third terminal and a ground, wherein the capacitor is connected between the first terminal or the second terminal and the output matching circuit, and wherein, when the first transmit signal and the second transmit signal are transmitted simultaneously, the first terminal or the second terminal is connected to the third terminal.

20. A radio frequency circuit comprising:

a first filter that has a passband including a transmit band of a first communication band;

a second filter that has a passband including a transmit band of a second communication band which is different from the first communication band;

a third filter that has a passband including a receive band of the first communication band;

a low-noise amplifier that is connected to the third filter; and a switch that has a first terminal, a second terminal, and a third terminal, wherein the first communication band and the second communication band are communication bands available for simultaneous transmission, wherein at least a part of a frequency range of inter-modulation distortion overlaps at least a part of the receive band of the first communication band, the inter-modulation distortion occurring between a first transmit signal in the first communication band and a second transmit signal in the second communication band, wherein the first terminal is connected to the low-noise amplifier, and the third terminal is connected to the third filter, wherein the radio frequency circuit further includes a circuit connected to the second terminal, and wherein the circuit includes at least one of an inductor and a capacitor.

* * * * *